（12）United States Patent
Baik

(10) Patent No.: US 12,021,671 B2
(45) Date of Patent: Jun. 25, 2024

(54) COMMUNICATION DEVICE FOR PERFORMING DIFFERENTIAL PHASE SHIFT KEYING BASED ON A PLURALITY OF PREVIOUS SIGNALS AND OPERATING METHOD THEREOF

(71) Applicant: SAMSUNG ELECTRONICS CO., LTD., Suwon-si (KR)

(72) Inventor: Jonghyun Baik, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 17/819,984

(22) Filed: Aug. 16, 2022

(65) Prior Publication Data

US 2023/0056358 A1   Feb. 23, 2023

(30) Foreign Application Priority Data

Aug. 17, 2021   (KR) .......................... 10-2021-0108180

(51) Int. Cl.
  *H04L 27/18*   (2006.01)
  *H03D 13/00*   (2006.01)
  *H04L 27/32*   (2006.01)

(52) U.S. Cl.
  CPC ........... *H04L 27/18* (2013.01); *H03D 13/001* (2013.01); *H04L 27/32* (2013.01)

(58) Field of Classification Search
  CPC ........ H04L 27/18; H04L 27/32; H03D 13/001
  USPC ........................................................ 375/308
  See application file for complete search history.

(56) References Cited

U.S. PATENT DOCUMENTS

| | | | |
|---|---|---|---|
| 6,072,802 A | 6/2000 | Uhm et al. | |
| 6,115,435 A | 9/2000 | Harada et al. | |
| 6,243,423 B1 | 6/2001 | Sakoda et al. | |
| 6,697,441 B1 | 2/2004 | Bottomley et al. | |
| 8,000,220 B2 | 8/2011 | Hashimoto et al. | |
| 8,885,776 B2 * | 11/2014 | Ozgur .................... | H04L 1/205 375/376 |
| 8,942,078 B2 | 1/2015 | Hashimoto et al. | |

(Continued)

FOREIGN PATENT DOCUMENTS

| | | |
|---|---|---|
| EP | 2238313 | 10/2010 |
| KR | 10-0713463 | 4/2007 |

OTHER PUBLICATIONS

European Search Report dated Jan. 4, 2023 in corresponding European Patent Application No. 22190475.8 (9 pages).

(Continued)

*Primary Examiner* — Qutbuddin Ghulamali
(74) *Attorney, Agent, or Firm* — F. CHAU & ASSOCIATES, LLC

(57) ABSTRACT

An method of determining a symbol according to a phase difference between input signals input in order of time may include calculating a first phase difference between a phase of a first previous signal received prior to a target signal and a phase of a second previous signal received prior to the first previous signal; calculating a second phase difference between a phase of the target signal and the phase of the second previous signal; calculating target likelihoods based on the first phase difference and the second phase difference; and determining an expected phase difference between the target signal and the first previous signal or an expected symbol for the target signal, based on the target likelihoods.

20 Claims, 13 Drawing Sheets

(56) References Cited

U.S. PATENT DOCUMENTS

| | | | |
|---|---|---|---|
| 9,143,273 B2* | 9/2015 | Sugihara | H04L 27/3845 |
| 9,455,822 B2* | 9/2016 | Matsumoto | H04B 1/76 |
| 2012/0141144 A1* | 6/2012 | Cai | H04B 10/616 |
| | | | 398/202 |
| 2015/0063495 A1* | 3/2015 | Qu | H04L 25/067 |
| | | | 375/330 |
| 2020/0196153 A1 | 6/2020 | Agarwal et al. | |

OTHER PUBLICATIONS

May, et al., "Turbo detection of convolutionally coded and differentially modulated signals", Signal Processing, Elsevier, Amsterdam, NL, vol. 80, No. 2, Feb. 1, 2000 (Feb. 1, 2000), pp. 349-355, XP004185884,ISSN: 0165-1684, DOI:10.1016/S0165-1684(99)00133-4.

Bluetooth Core Spec 5.2/ vol. 2. Part A. Radio Specification, Part B. Baseband Specification, Dec. 31, 2019, 3256 pages.

* cited by examiner

COMMUNICATION DEVICE FOR PERFORMING DIFFERENTIAL PHASE SHIFT KEYING BASED ON A PLURALITY OF PREVIOUS SIGNALS AND OPERATING METHOD THEREOF

CROSS-REFERENCE TO RELATED APPLICATION

This application is based on and claims priority under 35 U.S.C. § 119 to Korean Patent Application No. 10-2021-0108180, filed on Aug. 17, 2021, in the Korean Intellectual Property Office, the disclosure of which is incorporated by reference herein in its entirety.

BACKGROUND

One or more embodiments of the present disclosure relate to communication devices for wireless communication, and more particularly, to communication devices configured to perform differential phase shift keying (DPSK).

DPSK refers to a digital modulation technology (e.g., modulation and demodulation technology) for determining currently received symbol data based on a phase difference corresponding to two consecutive symbols. DPSK technology may convey data by changing (e.g., modulating) the phase shift of each symbol with respect to the phase of the previous symbol sent. For example, in a communication device configured to perform Bluetooth communication, a phase difference of an enhanced data rate (EDR) packet may be a DPSK symbol. In some aspects, when a communication device receives a signal including a phase error, the phase error affects both previous and subsequent symbols. Moreover, once a symbol error occurs, error propagation may result (e.g., where many or all of the subsequent symbols may be affected by the symbol error).

Some devices may implement error-detecting code, such as a cyclic redundancy check (CRC), to detect accidental or unintentional changes to raw data. When a communication device performs CRC correction, a soft-output of a demodulator may reflect a relative reliability difference between information bits in a packet to operate normally. When error propagation occurs, accuracy of such reliability regarding the soft-out may decrease. Accordingly, there is a need in the art for improved wireless communication (e.g., DPSK) techniques.

SUMMARY

One or more embodiments of the present disclosure may provide a method of determining a symbol accurately corresponding to a phase difference with high reliability to reduce error propagation occurring in differential phase shift keying (DPSK).

According to an aspect of the present disclosure, there is provided a method of determining a symbol according to a phase difference between input signals input in order of time, the method including: calculating a first phase difference between a phase of a first previous signal and a phase of a second previous signal, wherein the first previous signal is received prior to a target signal, and wherein the second previous signal is received prior to the first previous signal; calculating a second phase difference between a phase of the target signal and the phase of the second previous signal; calculating, based on the first phase difference and the second phase difference, target likelihoods that a phase difference between the target signal and the first previous signal corresponds to each of a plurality of symbols; and determining, based on the calculated target likelihoods, an expected symbol for the target signal or an expected phase difference between the target signal and the first previous signal.

According to another aspect of the present disclosure, there is provided a method of determining a symbol corresponding to an input signal, the method including: generating a first phase difference between a first input signal and a previous signal, wherein the first input signal is input in a previous sequence preceding a target sequence, and wherein the previous signal is received prior to the previous sequence; generating a second phase difference between a second input signal and the previous signal, wherein the second input signal is input in the target sequence; and determining an expected phase difference between the second input signal and the first input signal based on the first phase difference and the second phase difference.

According to another aspect of the present disclosure, there is provided a communication device including: a first phase difference calculator configured to calculate a first phase difference between a phase of a first previous signal and a phase of a second previous signal, wherein the first previous signal is received prior to a target signal, and wherein the second previous signal is received prior to the first previous signal; a second phase difference calculator configured to calculate a second phase difference between a phase of the target signal and the phase of the second previous signal; a target likelihood generator configured to generate target likelihoods that a phase difference between the target signal and the previous first previous signal corresponds to each of a plurality of symbols based on the first phase difference and the second phase difference; and an expected value determiner configured to determine, based on the target likelihoods, and expected symbol for the target signal or an expected phase difference between the target signal and the first previous signal.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
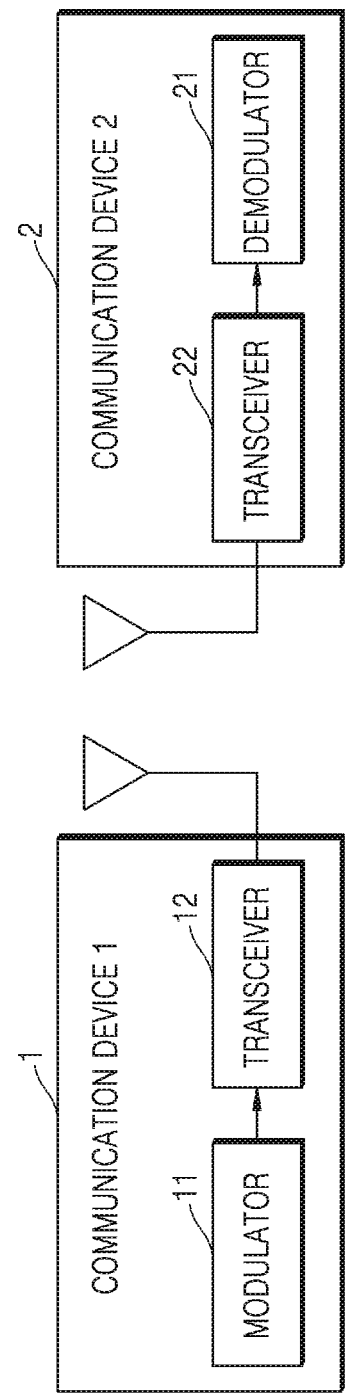
FIG. 1 is a block diagram of a communication system according to an embodiment.

DPSK refers to a digital modulation technology (e.g., modulation and demodulation technology) for determining currently received symbol data based on a phase difference corresponding to two consecutive symbols. DPSK technology may convey data by changing (e.g., modulating) the phase shift of each symbol with respect to the phase of the previous symbol sent. However, when a communication device receives a signal including a phase error, the phase error may affect both previous symbols and subsequent symbols. Moreover, once a symbol error occurs, error propagation may result where multiple symbols (e.g., many or all of the subsequent symbols) may be affected by the symbol error.

In some examples, to prevent such error propagation, a communication device may conduct (e.g., determine) hard-decision techniques on phase differences of consecutive signals. After the hard-decision, the phase differences may be accumulated to calculate a difference with a phase of a target signal. Even in such examples, there still is a possibility of incorrect correspondence to a symbol by the communication device (e.g., and errors may thus not be corrected even through implementation of error-detecting code, such as a cyclic redundancy check (CRC) correction).

According to the techniques described herein, a communication device may more efficiently determine a symbol of a target signal obtained in a target sequence (e.g., a current sequence). For instance, a communication device may determine a symbol of a target signal (obtained in a target sequence) based on phases of previous signals (obtained in a plurality of previous sequences) to accurately determine a symbol of a target signal corresponding to a calculated phase difference. For example, the communication device may calculate a phase difference of a plurality of previous signals, as well as a phase difference between the target signal and a previous signal. The communication device may further calculate a likelihood that the two phase differences correspond to each symbol (e.g., and the communication device may calculate an expected value for the target signal based on the likelihood that the phase difference corresponds to each symbol).

As an example, a communication device may use input signals received in a plurality of previous sequences preceding a target sequence in order to determine a symbol corresponding to an input signal received in the target sequence. For instance, a communication device may determine a first phase difference PD1 and a second phase difference PD2, where the first phase difference PD1 is calculated between a first previous signal n−1 and a second previous signal n−2, and the second phase difference PD2 is calculated between a target signal n and the second previous signal n−2. As described in more detail herein, the communication device may then determine an expected phase difference EPD and/or an expected symbol ES for the target signal, based on the calculated first phase difference PD1 and the second phase difference PD2.

Hereinafter, embodiments of the present disclosure will be described in detail with reference to the accompanying drawings.

FIG. 1 is a block diagram of a communication system according to one or more embodiments of the present disclosure.

With reference to FIG. 1, a communication system may include a first communication device 1 and a second communication device 2 configured to wirelessly communicate through a channel (e.g., a wireless communications channel). Generally, the system of FIG. 1 may be any system for wireless communication. In some embodiments, the system may be a wireless communication system such as a 5th generation (5G) wireless system, a long term evolution (LTE) system, a WiFi system, etc., but the system is not limited thereto. In some embodiments, the system may be a wired communication system such as a storage system, a network system, etc. Hereinafter, aspects of the system may refer to aspects of a wireless communication system, but embodiments of the present disclosure are not limited thereto.

For example, the first communication device 1 may be a base station or a component included in a base station. The base station may refer to a fixed station which communicates with a terminal and/or other base stations, and may transmit and receive data and/or control information by communicating with a terminal and/or other base stations. The base station may be referred to as a Node B, an evolved-Node B (eNB), a base transceiver system (BTS), an access point (AP), a relay node, a remote radio head (RRH), a radio unit (RU), a small cell, etc.

For example, the second communication device 2 may be a terminal or a component included in a terminal. The terminal may be a wireless communication device, and may refer to various devices capable of transmitting and receiving data and/or control information by communicating with the first communication device 1. For example, the terminal may be referred to as a user equipment, a mobile station (MS), a mobile terminal (MT), a user terminal (UT), a subscriber station (SS), a wireless device, a handheld device, or some other suitable processing device.

As another example, the first communication device 1 may be a terminal or a component included in a terminal, and the second communication device 2 may be a base station or a component included in a base station. As another example, the first communication device 1 and the second communication device 2 may be a terminal or a component included in a terminal (e.g., the first communication device 1 and the second communication device 2 may each be terminals or components included in terminals).

The wireless communication network (e.g., between the first communication device 1 and the second communication device 2) may support communication among a plurality of users by sharing available network resources. For example, in a wireless communication network, information may be transmitted through various methods, such as code division multiple access (CDMA), frequency division multiple access (FDMA), time division multiple access (TDMA), orthogonal frequency division multiple access (OFDMA), single carrier frequency division multiple access (SC-FDMA), etc.

The first communication device 1 and the second communication device 2 may communicate with each other via uplink UL (e.g., from a terminal to a base station) and downlink DL (e.g., from a base station to a terminal) communications. In a wireless system such as an LTE system and an LTE-Advanced system, the uplink and the downlink may transmit and receive control information through a control channel such as a physical downlink control channel (PDCCH), a physical control format indicator channel (PCFICH), a physical hybrid ARQ indicator channel (PHICH), a physical uplink control channel (PUCCH), an enhanced physical downlink control channel (EPDCCH), etc., and may transmit and receive data through a data channel such as a physical downlink shared channel (PDSCH), a physical uplink shared channel (PUSCH), etc. Also, the control information may be transmitted by using the EPDCCH (enhanced PDCCH or extended PDCCH).

In addition, each of the first communication device 1 and the second communication device 2 may be a device including user equipment, and may transmit and receive information through a communication method such as near field communication (NFC), Bluetooth, etc. Each of the first communication device 1 and the second communication device 2 may include an NFC controller for use of NFC and a Bluetooth controller for use of Bluetooth. The first communication device 1 may generate a radio frequency (RF) signal corresponding to generated information and transmit the RF signal to the outside through at least one antenna. The second communication device 2 may receive the RF signal through at least one antenna, and provide information corresponding to the RF signal to a processor included in the second communication device 2.

The first communication device 1 may include a modulator 11, a transceiver 12, and an antenna. The modulator 11 may convert digital information into an RF signal, which is an analog signal. For example, when the modulator 11 modulates digital information into an analog signal based on DPSK, an analog signal having a phase difference corresponding to the digital information may be generated. The transceiver 12 may perform time-to-frequency conversion on a received signal or perform frequency-to-time conversion on a transmission signal. Further, the transceiver 12 may include an analog down-conversion mixer, and generate a baseband signal by down-converting a frequency of a received signal (or a data signal). The first communication device 1 may transmit an RF signal through a transmission antenna.

The second communication device 2 may include a demodulator 21, a transceiver 22, and an antenna. The second communication device 2 may receive an RF signal through a receiving antenna. The transceiver 22 of the second communication device 2 may obtain a signal of a frequency to be read by performing the time-to-frequency conversion on the received RF signal. The demodulator 21 may generate digital information based on the RF signal obtained by the transceiver 22. For example, when the demodulator 21 demodulates digital information from an analog signal based on DPSK, digital information may be generated based on a phase difference of received consecutive analog signals.

A transceiver (e.g., transceiver 12 and transceiver 22) may communicate bi-directionally, via antennas, wired, or wireless links as described above. For example, a transceiver (e.g., transceiver 12 and transceiver 22) may represent a wireless transceiver and may communicate bi-directionally with another wireless transceiver. A transceiver may also include or be connected to a modem to modulate the packets and provide the modulated packets to for transmission, and to demodulate received packets (e.g., as described in more detail herein in accordance with one or more aspects of the described techniques). In some examples, transceiver 12 and/or transceiver 22 may be tuned to operate at specified frequencies. For example, a modem of a communication device may configure a transceiver to operate at a specified frequency and power level based on the communication protocol used by the modem.

The demodulator 21 according to one or more embodiments of the present disclosure may use input signals received in a plurality of previous sequences preceding a target sequence to determine a symbol corresponding to an input signal received in the target sequence. The demodulator 21 may calculate a first phase difference between an input signal received in a first previous sequence and an input signal received in a second previous sequence preceding the first previous sequence, and the demodulator 21 may calculate a second phase difference between an input signal received in a target sequence and an input signal received in the second previous sequence. The demodulator 21 may determine an expected phase difference between a signal input in the target sequence and a signal input in the first previous sequence by calculating a likelihood that each of the first phase difference and the second phase difference corresponds to each of a plurality of symbols. According to one embodiment, the expected phase difference may be referred to as a soft-decision value.

In DPSK, a modulated signal's phase may be shifted relative to a previous signal element (e.g., rather than relative to a reference signal, a signal phase may follow a low state or a high state of a previous signal element). For DPSK modulation, a transmitted signal itself (e.g., preceding signal elements) may be used as the "reference point" for signal modulation.

Generally, for DPSK demodulation, the phase between two successive received symbols is compared and used to determine what the data must have been (e.g., demodulator 21 may compare the phase of a reversed bit with the phase of a previous bit). For instance, upon reception, the received symbols are not decoded one-by-one to constellation points. Instead, demodulator 21 may compare received symbols (e.g., the phases of received symbols) directly to one another to interpret (e.g., demodulate) received data.

Figure 2:
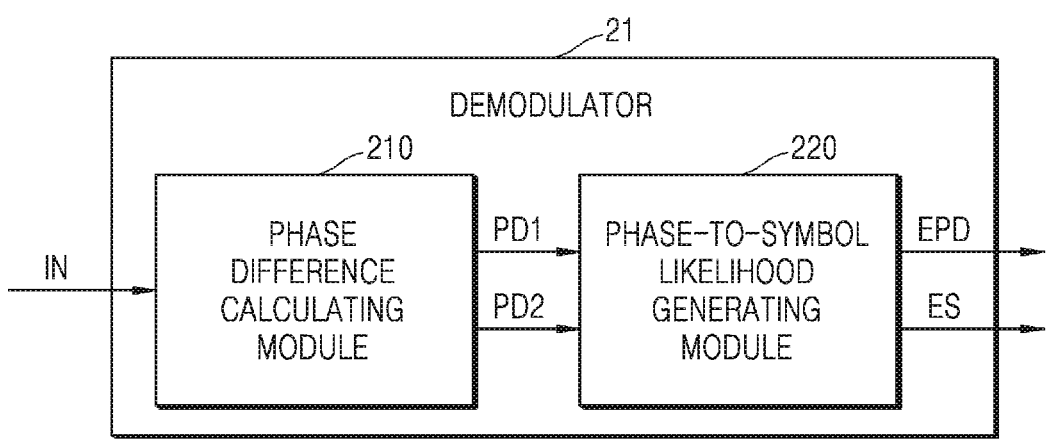
FIG. 2 is a block diagram of a configuration of a receiver configured to receive and demodulate an input signal according to an embodiment.

FIG. 2 is a block diagram of an example configuration of a receiver configured to receive and demodulate an input signal IN according to an embodiment.

With reference to FIG. 2, the demodulator 21 may include a phase difference calculating module 210 and a phase-to-symbol likelihood generating module 220. According to an embodiment, the phase difference calculating module 210 may receive an input signal IN in each sequence and calculate a phase difference between the received input signal IN and input signals IN received in a plurality of previous sequences. The sequence may be a time interval allocated in correspondence with each symbol, and a length of each sequence may be predefined in a communication system.

According to an embodiment, the phase difference calculating module 210 may output as a first phase difference PD1 a phase difference between a target signal input in a target sequence and a first previous signal received in a first previous sequence preceding the target sequence by one sequence. The phase difference calculating module 210 may output as a second phase difference PD2 a phase difference between a second previous signal received in a second previous sequence preceding the first previous sequence by one sequence and the target signal (e.g., the second previous sequence preceding the target sequence by two sequences). That is, the first phase difference PD1 may be a phase difference between input signals IN received consecutively, and the second phase difference PD2 may be a phase difference between input signals IN received in sequences apart from each other by two sequences. Hereinafter, a target sequence is described as preceding a first previous sequence by one sequence, and the first previous sequence is described as preceding a second previous sequence by one sequence; generally however, sequence differences of the present disclosure are not limited thereto.

According to an embodiment, a phase of the first previous signal and a phase of the second previous signal may be an input signal IN received in each sequence; however, according to another embodiment, the phase of the first previous signal and the phase of the second previous signal may be a sum of phase differences generated in each previous sequence since the reception of the input signal IN, and the phase differences generated in each sequence may be hard-decision phase differences. The hard-decision phase difference is described in more detail herein (e.g., at least with reference to FIGS. 6 and 7).

The phase-to-symbol likelihood generating module 220 may receive the first phase difference PD1 and the second phase difference PD2 generated from the phase difference calculating module 210, and phase-to-symbol likelihood generating module 220 may determine an expected phase difference EPD and/or an expected symbol ES for a target signal, based on the received first phase difference PD1 and the second phase difference PD2. At this time, the phase-to-symbol likelihood generating module 220 may delay the first phase difference PD1 by one sequence. That is, in some examples, the phase-to-symbol likelihood generating module 220 may determine the expected phase difference EPD or the expected symbol ES, based on the first phase difference PD1 between the first previous signal and the second previous signal and the second phase difference PD2 between the target signal and the second previous signal in a target sequence.

According to an embodiment, the phase-to-symbol likelihood generating module 220 may calculate first likelihoods that the first phase difference PD1 corresponds to each of a plurality symbols, and calculate second likelihoods that the second phase difference PD2 corresponds to each of the plurality of symbols.

In some examples, Bluetooth EDR packet payloads may include data symbols represented by phase variations (e.g., in a transmitted or received radio frequency (RF) signal). DQPSK can be used to modulate the payload of a Bluetooth EDR packet (e.g., where a phase of a current symbol, or a target symbol, may be indicated with reference to a phase of a preceding symbol, or a phase of one or more previous signals).

For example, a communication device configured to perform Bluetooth communication may calculate a likelihood that each phase difference corresponds to two symbols in enhanced data rate (EDR) EDR2 mode and a likelihood that each phase difference corresponds to each of four symbols in EDR3 mode. The phase-to-symbol likelihood generating module 220 may calculate a target likelihood, based on first likelihoods and second likelihoods, and determine the expected symbol ES based on the target likelihood and information per bit of each symbol or the expected phase difference EPD, based on the target likelihood and a phase corresponding to each symbol.

In some aspects, the phase difference calculating module 210 and the phase-to-symbol likelihood generating module 220 may include different hardware modules. However, the described techniques are not limited thereto, and the phase difference calculating module 210 and the phase-to-symbol likelihood generating module 220 may include different software modules provided in one hardware module (e.g., the phase difference calculating module 210 and the phase-to-symbol likelihood generating module 220 may include software that, when compiled and executed, cause a single hardware module to perform functions described herein.

In some cases, aspects of the present disclosure may be described below based on the components of FIG. 2.

Figure 3:
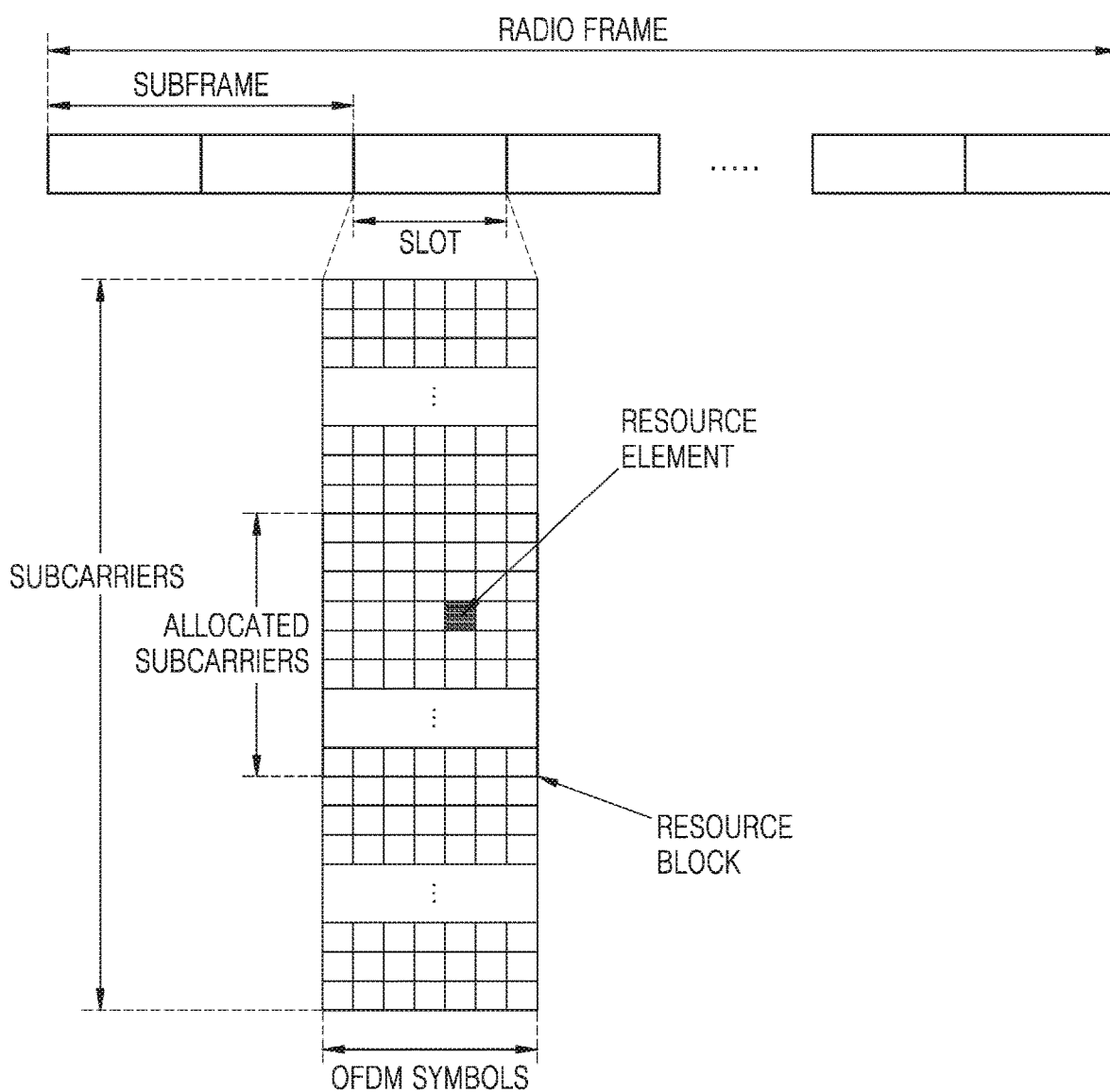
FIG. 3 is a diagram illustrating resource elements including symbols according to an embodiment.

FIG. 3 is a diagram illustrating resource elements including symbols according to an embodiment.

According to an embodiment of FIG. 3, the communication device may perform wireless communication based on a resource block consisting of resource elements in a wireless access network. In FIG. 3, the horizontal axis may represent a time domain (e.g., the x-axis may represent time resources for wireless communications), and the vertical axis may represent a frequency domain (e.g., the y-axis may represent frequency resources for wireless communications). A transmission unit (e.g., a minimum transmission unit) in the time domain may be referred to a symbol, and one symbol may be allocated to one time sequence. A plurality of symbols may constitute a slot, and two slots may constitute one subframe. For example, in an LTE wireless access network, a length of a slot may be 0.5 ms, and a length of a subframe may be 1.0 ms. Further, a radio frame is a time domain unit consisting of ten subframes. The minimum transmission unit in the frequency domain is a subcarrier, and a bandwidth of the entire system transmission bandwidth may include a plurality of subcarriers.

The basic unit of the resource in the time-frequency domain is a resource element (RE), which may be represented by a symbol index (e.g., an orthogonal frequency division multiples (OFDM) symbol index) and a subcarrier index. A resource block (RB) (e.g., or a physical resource block (PRB)) may be defined by a plurality of symbols (e.g., a plurality of consecutive OFDM symbols) in the time domain and by a plurality of consecutive subcarriers in the frequency domain.

Figure 4:
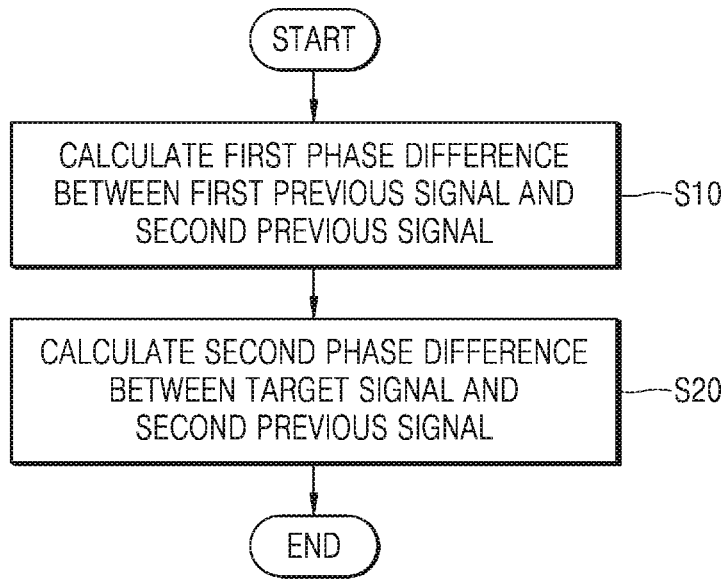
FIG. 4 is a flowchart illustrating a method of calculating a first phase difference and a second phase difference, based on a plurality of previous signals, according to an embodiment.
Figure 5:
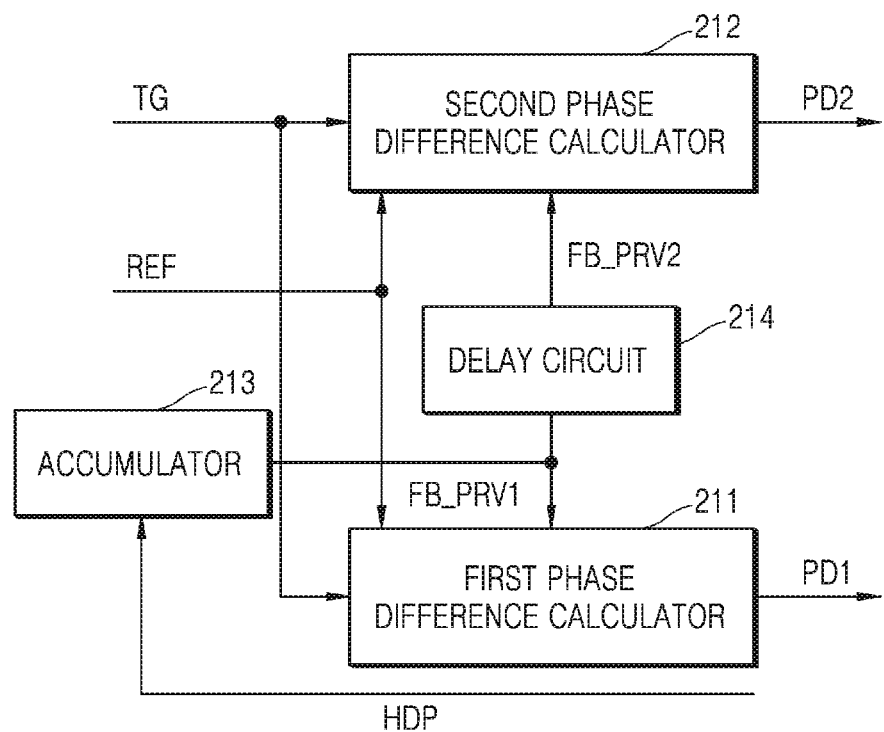
FIG. 5 is a diagram of a phase difference calculating module according to an embodiment.

FIG. 4 is a flowchart illustrating a method of calculating the first phase difference PD1 and the second phase difference PD2, based on a plurality of previous signals, according to an embodiment, and FIG. 5 is a diagram of the phase difference calculating module 210 according to an embodiment.

With reference to FIGS. 4 and 5, a communication device may calculate the first phase difference PD1 and the second phase difference PD2, based on phases of a plurality of input signals. Specifically, a first phase difference calculator 211 included in the phase difference calculating module 210 may generate the first phase difference PD1, and the second phase difference calculator 212 may generate the second phase difference PD2.

In operation S10, the demodulator 21 may calculate as the first phase difference PD1 as a difference between a phase of the first previous signal and a phase of the second previous signal. At this time, the second previous signal may be a signal received prior to the first previous signal. According to an embodiment, the communication device may calculate the first phase difference PD1 between the phase of the first previous signal and the phase of the second previous signal in the first previous sequence receiving the first previous signal, and the first phase difference PD1 may be delayed by a certain sequence and may be used to calculate the first likelihoods in the target sequence.

Specifically, according to an embodiment of FIG. 5 in which a target signal is received in a target sequence, the first phase difference calculator 211 may calculate a difference between a phase TG of a target signal and a phase FB_PRV1 of a first feedback previous signal, which has been received prior to the target signal and provided as feedback (e.g., as feedback to the first phase difference calculator 211). That is, the first phase difference calculator 211 may generate a difference between a phase of a first previous signal and a phase FB_PRV2 of a second feedback previous signal as the first phase difference PD1 in a first previous sequence preceding a target sequence.

In operation S20, the demodulator 21 may calculate the second phase difference PD2 between the target signal and the second previous signal. At this time, the second previous signal may be a signal received prior to the target signal by two or more sequences.

With reference to FIG. 5, in the target sequence, the second phase difference calculator 212 may receive the phase TG of the target signal and the phase FB_PRV2 of the second feedback previous signal, which has been delayed for a certain sequence (e.g., two or more sequences) and provided as feedback by a delay circuit 214. The second phase difference calculator 212, which has received the phase TG of the target signal and the phase FB_PRV2 of the second feedback previous signal, may output as the second phase difference PD2 a difference between the phase TG of the target signal and the phase FB_PRV2 of the second feedback previous signal. The delay circuit 214 may be a circuit configured to delay a received signal for a certain sequence and provide the signal to the second phase difference calculator 212. For example, the delay circuit 214, which has received the phase FB_PRV2 of the second feedback previous signal in the first previous sequence, may provide the phase FB_PRV2 of the second feedback previous signal to the second phase difference calculator 212 in a subsequent target sequence, and the delay circuit 214, which has received the phase FB_PRV1 of the first feedback previous signal in the target sequence, may provide the phase FB_PRV1 of the first feedback previous signal to the second phase difference calculator 212 in a sequence following the target sequence.

According to an embodiment, an accumulator 213 may at least temporarily store received feedback phase differences generated up to the previous sequence and accumulate the phase differences generated up to the previous sequence to generate a phase of a feedback previous signal. For example, the accumulator 213 may accumulate feedback phase differences generated up to the first previous sequence after initiating the demodulation operation, and generate the accumulated phase differences as the phase FB_PRV1 of the first feedback previous signal in the target sequence. At this time, the feedback phase differences received by the accumulator 213 may be hard-decision phase differences HDP. The hard-decision phase difference HDP is described in detail herein (e.g., at least with reference to FIGS. 6 and 7).

According to an embodiment, the first phase difference calculator 211 may calculate the first phase difference PD1 by subtracting the phase FB_PRV1 of the first feedback previous signal and a reference phase REF from the phase TG of the target signal, and the second phase difference calculator 212 may calculate the second phase difference PD2 by subtracting the phase FB_PRV2 of the second feedback previous signal and the reference phase REF from the phase TG of the target signal. That is, the first phase difference PD1 and the second phase difference PD2 calculated in an $n^{th}$ sequence, which is the target sequence, may be represented by the following Equation 1.

$$\Delta_1 \varnothing_n = \varnothing_n - f(\Delta \varnothing_{n-1}) - \varnothing_{ref}$$

$$\Delta_2 \varnothing_n = \varnothing_n - f(\Delta \varnothing_{n-2}) - \varnothing_{ref} \quad \text{Equation 1:}$$

Here, $\Delta_1 \varnothing_n$ represents the first phase difference PD1, $\Delta_2 \varnothing_n$ represents the second phase difference PD2, $\varnothing_n$ represents the phase TG of the target signal, $f(\Delta_1 \varnothing_n)$ represents a phase FB_PRV1 of the first feedback previous signal, $f(\Delta_2 \varnothing_n)$ represents a phase FB_PRV2 of the second feedback previous phase, and $\varnothing_{ref}$ represents the reference phase REF.

Figure 6:
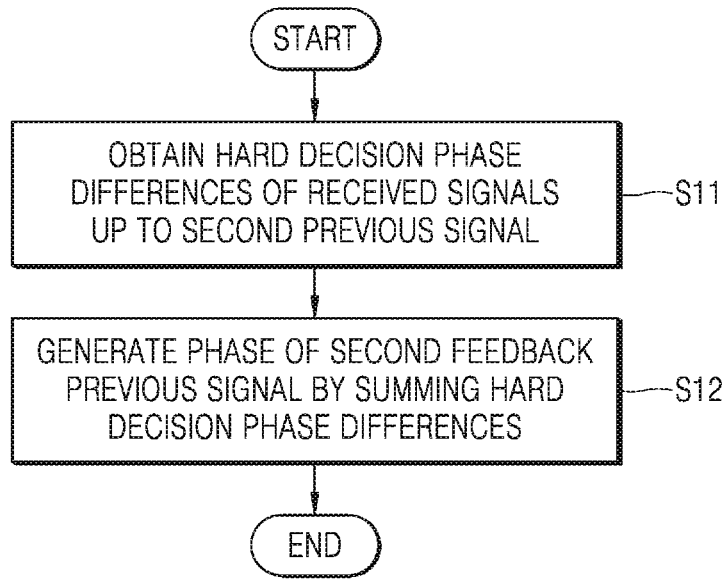
FIG. 6 is a flowchart illustrating a method of calculating a hard-decision phase difference according to an embodiment.
Figure 7:
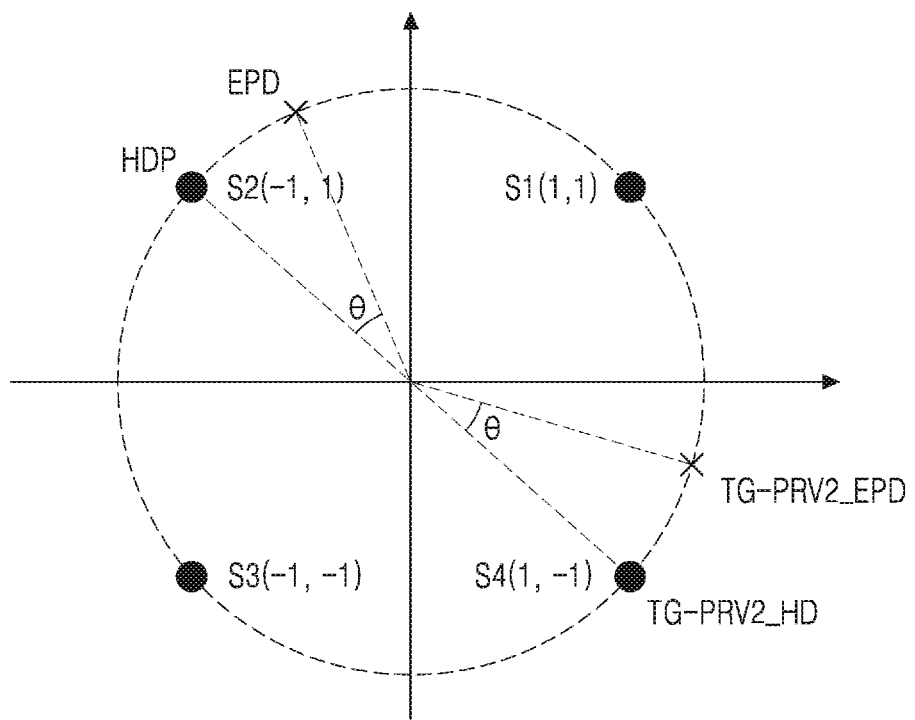
FIG. 7 is a graph showing a hard-decision phase difference of a phase difference calculated according to an embodiment.

FIG. 6 is a flowchart illustrating a method of calculating the hard-decision phase difference HDP according to an embodiment, and FIG. 7 is a graph showing the hard-decision phase difference HDP of a phase difference calculated according to an embodiment.

With reference to FIGS. 5 and 6, in the first previous sequence, the accumulator 213 may generate a phase of the second previous signal by summing feedback hard-decision phase differences HDP up to the second previous sequence, and in the target sequence, the accumulator 213 may generate a phase of the first previous signal by summing feedback hard-decision phase differences HDP up to the first previous sequence.

In operation S11, the accumulator 213 may obtain the hard-decision phase differences HDP of the signals received up to the second previous sequence. The hard-decision phase difference HDP may refer to a phase of a symbol which has been hard-decided (e.g., a symbol phase to which the expected phase difference EPD, determined by the demodulator 21 based on a target likelihood, corresponds to).

With reference to FIG. 7, the expected phase difference EPD determined by the demodulator 21 may not exactly correspond to a phase of each symbol. For example, a plurality of symbols may include four symbols each allocated in a quadrant, and the demodulator 21 may determine as the expected phase difference EPD a phase apart from a second symbol S2 by θ. At this time, the demodulator 21 performing the hard-decision operation may determine as the second symbol S2 a symbol corresponding to the expected phase difference EPD and provide to the accumulator 213, as feedback, a phase corresponding to the second symbol S2 as the hard-decision phase difference HDP.

In operation S12, the accumulator 213 may sum hard-decision phase differences HDP of signals received in each sequence up to the second previous sequence after initiating the demodulation operation to generate the phase FB_PRV2 of the second feedback previous signal.

The accumulator 213 may sum the hard-decision phase differences HDP generated in each sequence. For example, the accumulator 213 may add a feedback hard-decision phase difference HDP to a phase of a feedback previous signal generated in an immediately preceding sequence to update the phase of the feedback previous signal. The phase of the previous signal to be updated may be represented by the following Equation 2.

$$f(\Delta \phi_{n-1}) = \text{hard-decision}(\phi'_{n-1}) + f(\Delta \phi_{n-2})$$

$$f(\Delta \phi_{n-2}) = \text{hard-decision}(\phi'_{n-2}) + f(\Delta \phi_{n-3}) \quad \text{Equation 2:}$$

$f(\Delta \phi_{n-1})$ represents a phase FB_PRV1 of the first feedback previous signal, $f(\Delta \phi_{n-2})$ represents a phase FB_PRV2 of the second feedback previous signal, $f(\Delta\phi_{n-3})$ represents the third feedback previous signal FB_PRV3, hard-decision ($\phi'_{n-1}$) represents the hard-decision phase difference HDP for the first previous signal, and hard-decision($\phi'_{n-2}$) represents the hard-decision phase difference HDP for the second previous signal.

With reference to FIGS. 5 to 7, the second phase difference calculator 212 may receive the phase TG of the target signal and the phase FB_PRV2 of the second feedback previous signal, and the accumulator 213 may provide to the second phase difference calculator 212 the phase PRV2_HD of the second feedback previous signal generated by adding up the hard-decision phase differences HDP or the phase PRV2_EPD of the second feedback previous signal generated by adding up the expected phase differences EPD.

According to an embodiment, the second phase difference PD2 generated based on the phase PRV2_HD of the second feedback previous signal generated by adding up the hard-decision phase differences HDP may generate more accurate phase difference by preventing error propagation, and accordingly, a symbol corresponding to a phase difference may be accurately determined.

Generally, the phase of the feedback previous signal is not limited to the phase generated by adding up the phase differences corresponding to previous sequences by the accumulator 213, and it may be a phase of an input signal sampled in a previous sequence.

Figure 8:
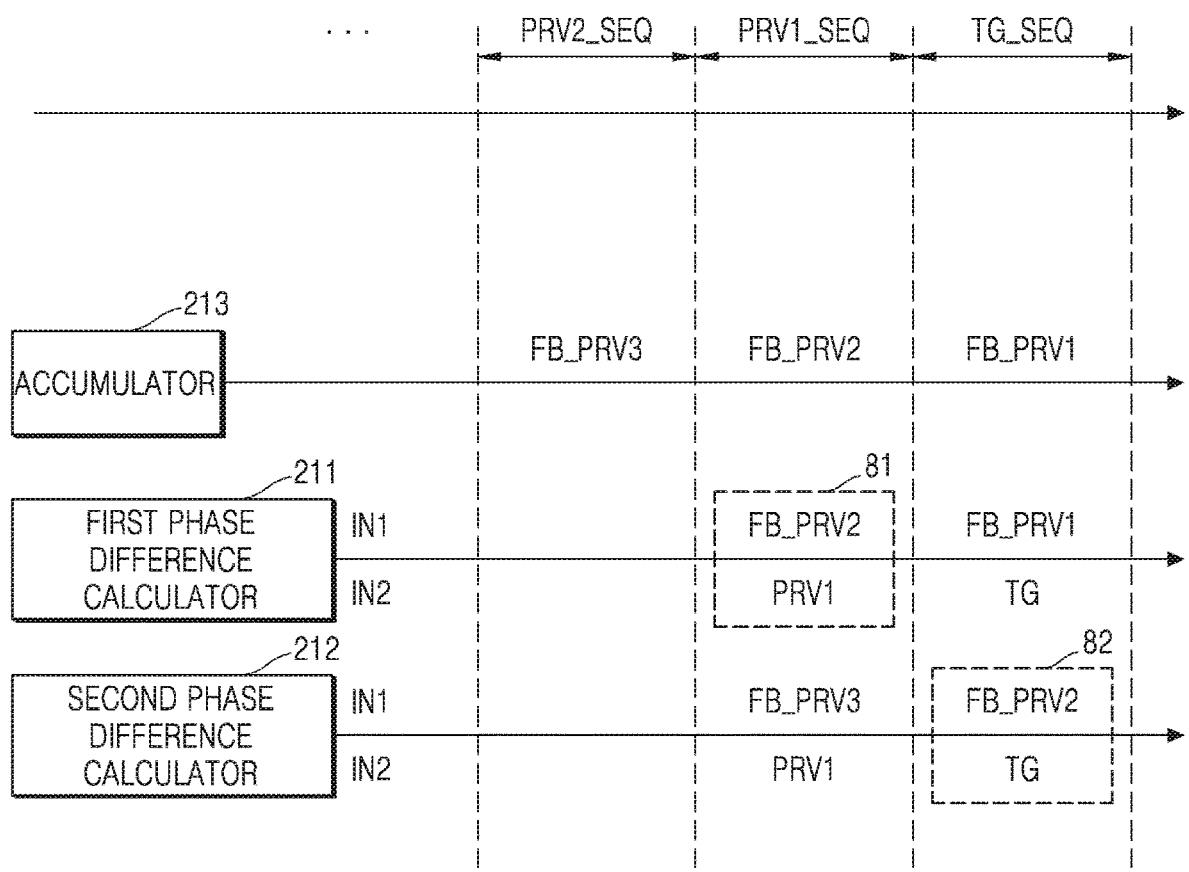
FIG. 8 is a diagram illustrating signals which a phase difference calculating module receives in each sequence according to an embodiment.

FIG. 8 is a diagram illustrating signals that the phase difference calculating module 210 may receive in each sequence according to an embodiment.

With reference to FIG. 8, the accumulator 213, the first phase difference calculator 211, and the second phase difference calculator 212 may transmit and receive phases of a signal in a consecutive second previous sequence PRV2_SEQ, a first previous sequence PRV1_SEQ, and a target sequence TG_SEQ. The first phase difference calculator 211 and the second phase difference calculator 212 may receive phases of a signal through two input terminals, and may also receive through a common input terminal a phase of a signal received from a transceiver in each sequence.

According to an embodiment, the accumulator 213 may output a phase of a feedback previous signal generated according to embodiments of FIGS. 6 and 7. For example, in the second previous sequence PRV2_SEQ, the accumulator 213 may output the phase FB_PRV3 of a third feedback previous signal (e.g., a third sequence preceding the second sequence) obtained by adding up the hard-decision phase differences HDP up to the third previous sequence, output the phase FB_PRV2 of the second feedback previous signal obtained by adding up the hard-decision phase differences HDP up to the second previous sequence PRV2_SEQ in the first previous sequence PRV1_SEQ, and output the phase FB_PRV1 of the first feedback previous signal obtained by adding up the hard-decision phase differences HDP up to the first previous sequence PRV1_SEQ in the target sequence TG_SEQ.

The first phase difference calculator 211 may receive a phase output from the accumulator 213 through a first input terminal IN1, and receive a phase corresponding to each sequence received from the transceiver through a second input terminal IN2. For example, in the first previous sequence PRV1_SEQ, the first phase difference calculator 211 may receive the phase FB_PRV2 of the second feedback previous signal through the first input terminal IN1, and receive the phase PRV1 of the first previous signal through the second input terminal IN2. In the target sequence TG_SEQ, the first phase difference calculator 211 may receive the phase FB_PRV1 of the first feedback previous signal through the first input terminal IN1, and receive the phase TG of the target signal through the second input terminal IN2.

The second phase difference calculator 212 may receive an output phase of the accumulator 213 of the immediately preceding sequence from the delay circuit through the first input terminal IN1, and receive a phase of a signal corresponding to each sequence received from the transceiver through the second input terminal IN2. For example, in the first previous sequence PRV1_SEQ, the second phase difference calculator 212 may receive the phase of the third feedback previous signal through the first input terminal IN1, and receive the phase PRV1 of the first previous signal through the second input terminal IN2. In the target sequence TG_SEQ, the second phase difference calculator 212 may receive the phase FB_PRV2 of the second feedback previous signal through the first input terminal IN1, and receive the phase TG of the target signal through the second input terminal IN2.

According to FIGS. 10 and 11 described below, when generating first likelihoods, the demodulator 21 may use the first phase difference PD1 of an immediately preceding sequence through the delay circuit. For example, the demodulator 21 may use the first phase difference PD1 generated in the first previous sequence PRV1_SEQ to calculate the first likelihoods in the target sequence TG_SEQ. At this time, the first phase difference PD1 generated in the first previous sequence PRV1_SEQ may be a phase difference generated based on the phase FB_PRV2 of the second feedback previous signal and the phase PRV1 of the first previous signal. Accordingly, in the target sequence TG_SEQ, the demodulator 21 may calculate the first likelihood based on a first phase difference 81 generated by the phase FB_PRV2 of the second feedback previous signal and the phase PRV1 of the first previous signal, and calculate the second likelihood, based on a second phase difference 82 generated by the phase FB_PRV2 of the second feedback previous signal and the phase TG of the target signal.

Figure 9:
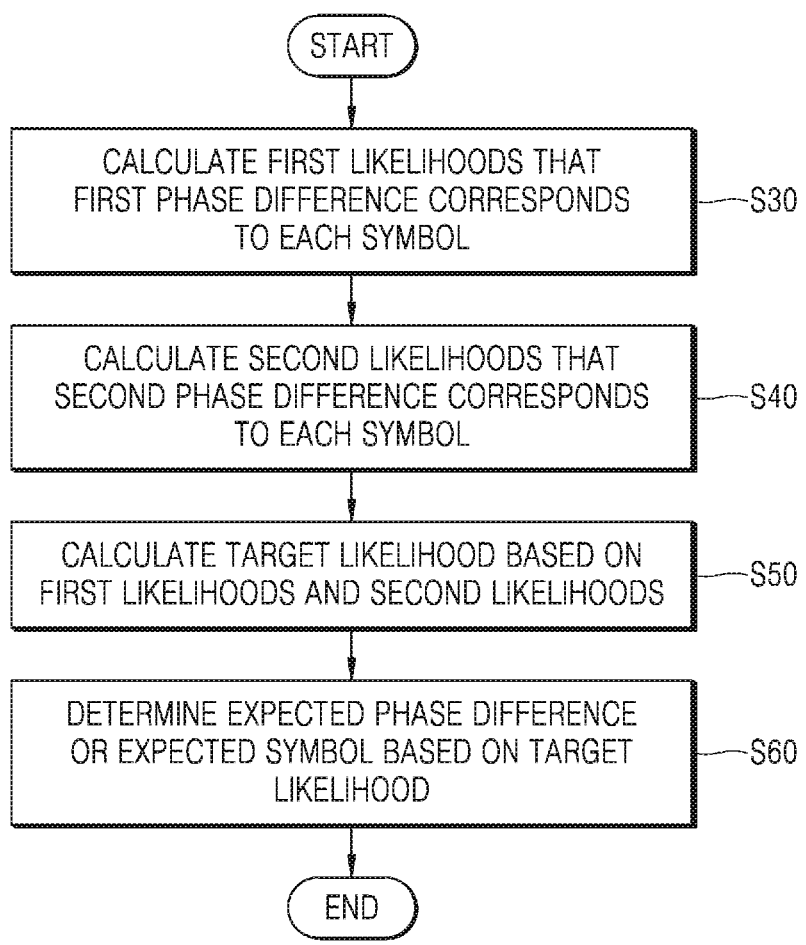
FIG. 9 is a flowchart illustrating a method of determining an expected phase difference or an expected symbol by calculating a target likelihood according to an embodiment.
Figure 10:
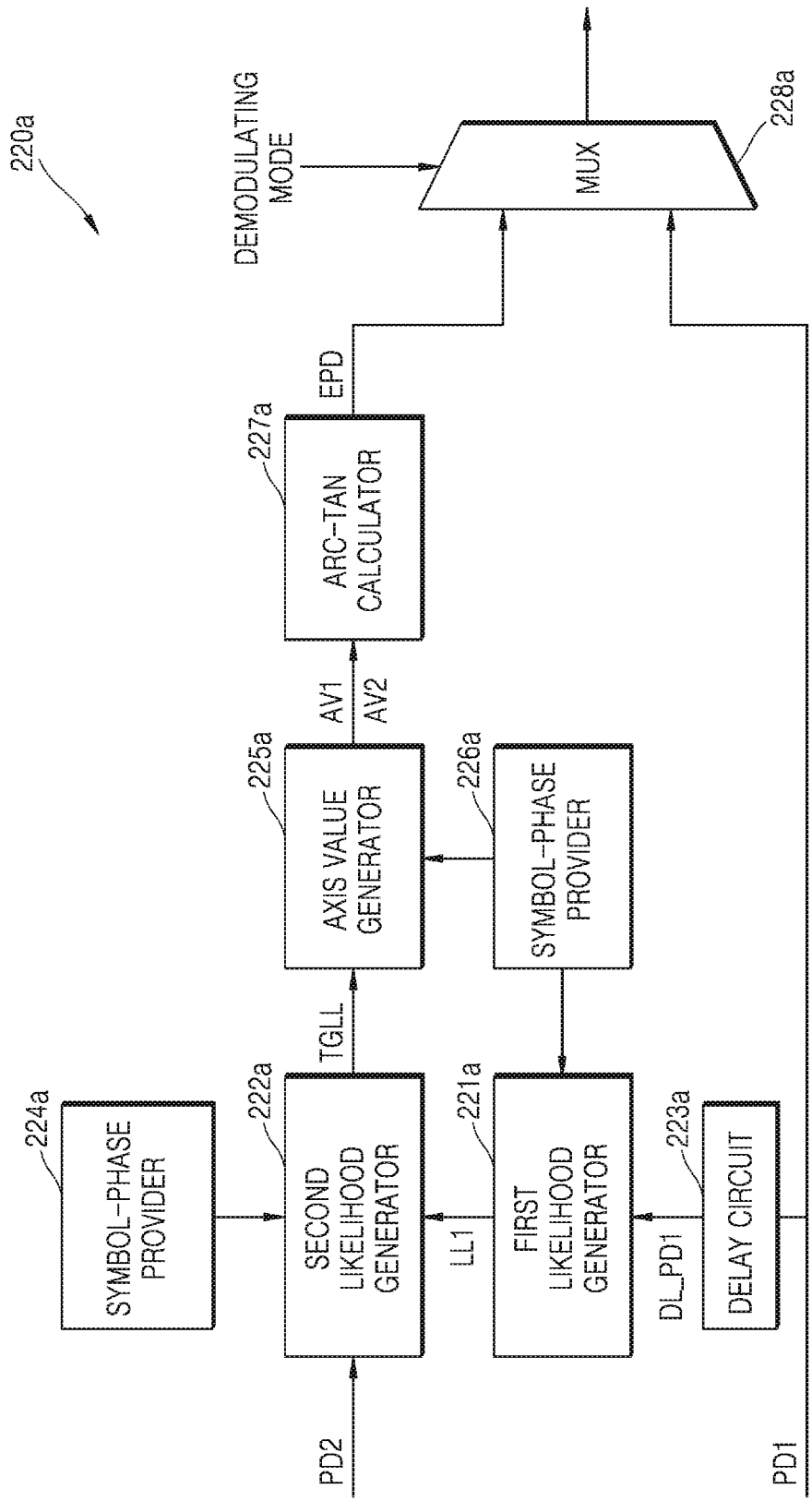
FIGS. 10 and 11 are block diagrams illustrating a configuration of a phase-to-symbol likelihood generating module according to embodiments.
Figure 11:
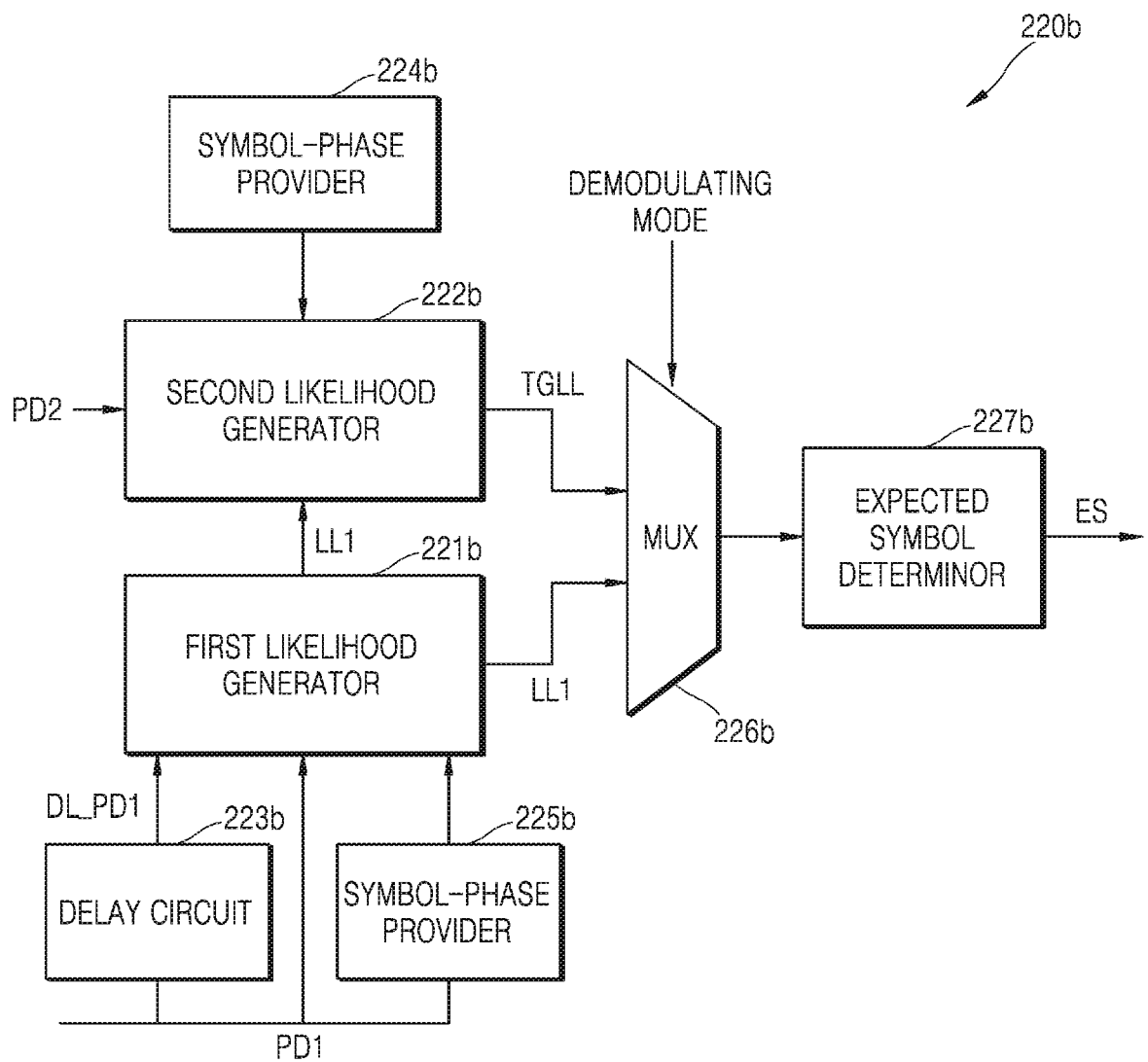

FIG. 9 is a flowchart illustrating a method of determining the expected phase difference EPD or the expected symbol ES by calculating a target likelihood according to an embodiment, and FIGS. 10 and 11 are block diagrams illustrating a configuration of the phase-to-symbol likelihood generating module 220 according to embodiments.

With reference to FIGS. 9 to 11, the demodulator 21 may calculate first likelihoods LL1 and second likelihoods LL2, based on the first phase difference PD1 and the second phase difference PD2, and determine the expected phase difference EPD or the expected symbol ES by calculating the target likelihood, based on the first likelihoods LL1 and the second likelihoods LL2. An embodiment of FIG. 10 illustrates the phase-to-symbol likelihood generating module 220 configured to determine the expected phase difference EPD, and an embodiment of FIG. 11 illustrates the phase-to-symbol likelihood generating module 220 configured to determine the expected symbol ES.

With reference to FIGS. 9 to 11, in operation S30, first likelihood generators 221a and 221b may calculate the first likelihoods LL1 that the first phase difference PD1 corresponds to each of a plurality of symbols. For example, when the plurality of symbols include four symbols, the first likelihood generators 221a and 221b may generate four first likelihoods LL1. That is, the first likelihood generators 221a and 221b may calculate as the first likelihoods LL1 likelihoods that the first phase difference PD1 corresponds to first to fourth symbols S1 to S4. According to an embodiment, the first likelihoods LL1 may be calculated based on a Euclidean squared distance between the first phase difference PD1 and a phase corresponding to each symbol, and according to another embodiment, the first likelihoods LL1 that the first phase difference PD1 corresponds to each symbol may be selected from a lookup table based on the reliability of the first phase difference PD1.

According to an embodiment, delay circuits 223a and 223b may delay the first phase difference PD1 for a certain sequence from a sequence in which the first phase difference PD1 has been received and provide a first delay phase difference DL_PD1 to the first likelihood generators 221a and 221b. For example, the delay circuits 223a and 223b, which have received the first phase difference PD1 in the first previous sequence, may delay the first phase difference PD1 for a sequence and provide the first delay phase difference DL_PD1 to the first likelihood generators 221a and 221b. That is, with reference to FIG. 8, the delay circuits 223a and 223b may provide the first phase difference PD1, which is generated by the phase FB_PRV2 of the second feedback previous signal and the phase PRV1 of the first previous signal in the first previous sequence, to the first likelihood generators 221a and 221b in the target sequence. Accordingly, in the target sequence, the first likelihood generators 221a and 221b may generate the first likelihoods LL1 based on the first phase difference PD1 between the first previous signal and the second previous signal.

In operation S40, the second likelihood generators 222a and 222b may calculate the second likelihoods LL2 that the second phase difference PD2 corresponds to each of the plurality of symbols. For example, the second likelihood generators 222a and 222b may calculate as the second likelihoods LL2 likelihoods that the second phase difference PD2 corresponds to the first to fourth symbols S1 to S4. According to an embodiment, the second likelihoods LL2 may be calculated based on a Euclidean squared distance between the second phase difference PD2 and a phase corresponding to each symbol, and according to another embodiment, the second likelihoods LL2 that the second phase difference PD2 corresponds to each symbol may be selected from a lookup table based on the reliability of the second phase difference PD2.

In operation S50, the second likelihood generators 222a and 222b may receive the first likelihoods LL1, and calculate target likelihoods TGLL, based on the first likelihoods LL1 and the second likelihoods LL2. According to an embodiment, the first likelihoods LL1 may be likelihoods that a difference between the phase PRV1 of the first previous signal and the phase PRV2 of the second previous signal corresponds to each symbol and the second likelihoods LL2 may be likelihoods that a difference between the phase TG of the target signal and the phase PRV2 of the second previous signal corresponds to each symbol. At this time, the target likelihoods TGLL may be likelihoods that the phase TG of the target signal and the phase PRV1 of the first previous signal correspond to each symbol.

Specifically, the second likelihood generators 222a and 222b may receive the first likelihood LL1 that the first phase difference PD1 corresponds to a $j^{th}$ symbol (j is a natural number), which is one of the plurality of symbols. To calculate a likelihood that a difference between the phase TG of the target signal and the phase PRV1 of the first previous signal corresponds to an $i^{th}$ symbol (i is a natural number), the second likelihood generators 222a and 222b may multiply the second likelihood LL2 that the second phase difference PD2 corresponds to a sum of the $i^{th}$ symbol and the $j^{th}$ symbol by the first likelihood LL1 that the first phase difference PD1 corresponds to the $j^{th}$ symbol (j is a natural number). That is, the second likelihood generator may calculate the likelihood that the first phase difference PD1 is the $j^{th}$ symbol and the difference between the phase TG of the target signal and the phase PRV1 of the first previous signal corresponds to the $i^{th}$ symbol.

The second likelihood generators 222a and 222b may sum products of the first likelihood LL1 when the first phase difference PD1 corresponds to all symbols and the second likelihoods LL2 corresponding thereto to calculate the likelihood that the difference between the phase TG of the target signal and the phase PRV1 of the first previous signal corresponds to the $i^{th}$ symbol, which may be represented by the following Equation 3.

$$Pr\{\Delta\phi_n = c_i\} = \sum_{j=0}^{2^{datarate}-1} Pr\{\Delta\phi_n = c_i | \Delta\phi_{n-1} = c_j\} \cdot Pr\{\Delta\phi_{n-1} = c_j\}$$

Equation 3

Here, $Pr\{\Delta\phi_n=c_i\}$ represents the likelihood that the difference between the phase TG of the target signal and the phase PRV1 of the first previous signal corresponds to the $i^{th}$ symbol, and $Pr\{\Delta\phi_n=c_i|\Delta\phi_{n-1}=c_j\}$ represents the conditional likelihood that the difference between the phase TG of the target signal and the phase PRV1 of the first previous signal corresponds to the $i^{th}$ symbol when the first phase difference PD1 corresponds to the $j^{th}$ symbol. That is, $Pr\{\Delta\phi_n=c_i|\Delta\phi_{n-1}=c_j\}$ may be the likelihood that the second phase difference PD2 corresponds to a symbol obtained by combining the $i^{th}$ symbol to the $j^{th}$ symbol. $Pr\{\Delta\phi_{n-1}=c_j\}$ may be the likelihood that the first phase difference PD1 is the $j^{th}$ symbol.

For example, when the plurality of symbols include four symbols as illustrated in an embodiment of FIG. 7, the second likelihood generators 222a and 222b may sum products of four first likelihoods LL1 and second likelihoods LL2 to calculate a likelihood that the difference between the phase TG of the target signal and the phase PRV1 of the first previous signal corresponds to the first symbol S1. The second likelihood generators 222a and 222b may multiply the first likelihood LL1 that the first phase difference PD1 corresponds to the first symbol S1 and the second likelihood LL2 that the second phase difference PD2 corresponds to the second symbol S2 and multiply the first likelihood LL1 that the first phase difference PD1 corresponds to the second symbol S2 and the second likelihood LL2 that the second phase difference PD2 corresponds to the third symbol S3. The second likelihood generators 222a and 222b may multiply the first likelihood LL1 that the first phase difference PD1 corresponds to the third symbol S3 and the second likelihood LL2 that the second phase difference PD2 corresponds to the fourth symbol S4 and multiply the first likelihood LL1 that the first phase difference PD1 corresponds to the fourth symbol S4 and the second likelihood LL2 that the second phase difference PD2 corresponds to the first symbol S1. The second likelihood generators 222a and 222b may sum all products of four first likelihoods LL1 and four second likelihoods LL2 to calculate the likelihood that the difference between the phase TG of the target signal and the phase PRV1 of the first previous signal corresponds to the first symbol S1.

The second likelihood calculators 222a and 222b may calculate the target likelihood TGLL that the difference between the phase TG of the target signal and the phase PRV1 of the first previous signal corresponds to the $i^{th}$ symbol and in a similar way, calculate the target likelihoods TGLL that the difference between the phase TG of the target signal and the phase PRV1 of the first previous signal corresponds to all symbols.

In operation S60, the demodulator 21 may determine the expected phase difference EPD or the expected symbol ES, based on the target likelihoods TGLL. The expected phase difference EPD may be an expected value for the difference between the phase of the target signal and the phase PRV1 of the first previous signal generated based on the target likelihoods TGLL, and the expected symbol ES may be a symbol corresponding to the expected phase difference EPD.

With reference to FIG. 10, an axis value generator 225a may receive the target likelihoods TGLL and multiply a target likelihood corresponding to each of a plurality of symbols by a first axis value and a second axis value of each symbol. The first axis value may be an X-axis value of each symbol, and the second axis value may be a Y-axis value of each symbol. For example, with reference to FIG. 8, the axis value generator 225a may multiply the target likelihood that the target phase difference, which is a difference between the phase of the target signal and the phase PRV1 of the first previous signal, corresponds to the first symbol S1 by 1, which is the X-axis value of the first symbol S1, and multiply the target likelihood that the target phase difference corresponds to the first symbol S1 by 1, which is the Y-axis value of the first symbol S1. In this manner, the axis value generator 225a may multiply the target likelihoods TGLL that the target phase difference corresponds to the second symbol S2 to the fourth symbol S4 by the first axis value and the second axis value.

The axis value generator 225a may determine a first axis expected value AV1 and a second axis expected value AV2 by summing products of the target likelihoods TGLL and each axis value corresponding to the target likelihoods TGLL per each axis. That is, the first axis expected value AV1 and the second axis expected value AV2 may be represented by the following Equation 4.

$$I_n = \cos(\Delta\phi_n) = \sum_{i=0}^{2^{datarate}-1} \cos(c_i) \cdot Pr\{\Delta\phi_n = c_i\}$$

$$Q_n = \sin(\Delta\phi_n) = \sum_{i=0}^{2^{datarate}-1} \sin(c_i) \cdot Pr\{\Delta\phi_n = c_i\}$$

Equation 4

Here, $I_n$ represents the first axis expected value AV1, $Q_n$ represents the second axis expected value AV2, $\cos(c_i)$ represents the first axis value of the $i^{th}$ symbol, and $\sin(c_i)$ represents the second axis value of the $i^{th}$ symbol.

The axis value generator 225a may provide the first axis expected value AV1 and the second axis expected value AV2 to an arc-tangent calculator, and the arc-tangent calculator 227a may output the expected phase difference EPD by performing an arc-tangent operation on a ratio between the first axis expected value AV1 and the second axis expected value AV2 according to the following Equation 5.

$$\Delta\phi_n = \tan^{-1}\left(\frac{Q_n}{I_n}\right)$$

Equation 5

The symbol-phase providers 224a and 226a may provide phases corresponding to each symbol to the first likelihood generator, the second likelihood generator, and the axis value generator 225a. According to an embodiment, the first likelihood generator and the second likelihood generator may calculate a distance between the phase corresponding to each symbol provided from the symbol-phase providers 224a and 226a and the first phase difference PD1 as well as the second phase difference PD2 when calculating a first distance and a second distance according to an embodiment of FIG. 13 described below.

According to an embodiment, the demodulator 21 may further include a multiplexer 228a, and the multiplexer 228a may output one of the first phase difference PD1 and the expected phase difference EPD generated in the target sequence based on a demodulating mode. For example, the multiplexer 228a may output as a final phase difference the first phase difference PD1 when the multiplexer 228a receives a first demodulating mode, and output as a final phase difference the expected phase difference EPD when the multiplexer 228a receives a second demodulating mode. The first demodulating mode may be a mode in which a demodulation operation is performed at a rapid rate by omitting the operation of generating the expected phase difference EPD, and the second demodulating mode may be a mode in which the demodulation operation is performed accurately by generating the expected phase difference EPD, based on the phase of a plurality of previous signals.

With reference to FIG. 11, the demodulator 21 may include an expected symbol determiner 227b, and the expected symbol determiner 227b may output the expected symbol ES for the target signal, based on an output of a multiplexer 226b. The multiplexer 226b may output one of the target likelihood and the first likelihood according to the demodulating mode.

For example, when the demodulator 21 receives the first demodulating mode, the first likelihood generator 221b may not receive the first phase difference PD1 through the delay circuit, and generate the first likelihoods LL1 by receiving the first phase difference PD1 between the phase TG of the target signal and the phase PRV1 of the first previous signal generated in the target sequence. In the first demodulating mode, the multiplexer 226b may output the first likelihoods LL1 generated by the first likelihood generator 221b. When the demodulator 21 receives the second demodulating mode, the multiplexer 226b may provide the target likelihoods TGLL to the expected symbol determiner 227b. The method of determining the expected symbol ES based on the likelihoods received by the expected symbol determiner 227b will be described later with reference to FIG. 12.

The symbol-phase providers 224a and 225a may provide phases corresponding to each symbol to the first likelihood generator 221b and the second likelihood generator 222b. According to an embodiment, the first likelihood generator 221b and the second likelihood generator 222b may calculate a distance between the phase corresponding to each symbol provided from the symbol-phase providers 224b and 225b and the first phase difference PD1 as well as the second phase difference PD2 when calculating a first distance and a second distance according to an embodiment of FIG. 13 described below.

Figure 12:
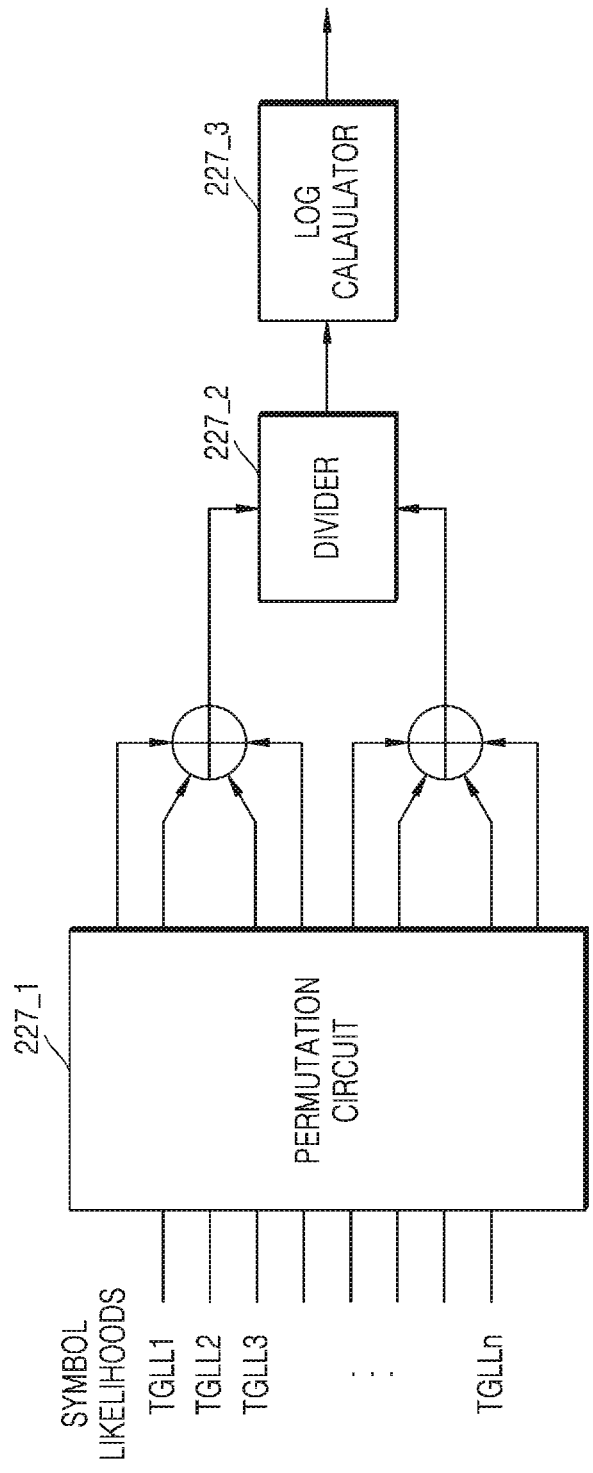
FIG. 12 is a block diagram illustrating a configuration of an expected symbol determiner according to an embodiment.

FIG. 12 is a block diagram illustrating configuration of the expected symbol determiner 227b according to an embodiment.

With reference to FIG. 12, the expected symbol determiner 227b may include a permutation circuit 227_1, a divider 227_2, and a log calculator 227_3, and determine a symbol corresponding to the target likelihoods TGLL by bit. The permutation circuit 227_1 may determine the expected symbol ES, based on a combination of target likelihoods TGLL predetermined per bit.

For example, when a plurality of symbols include four symbols according to an embodiment of FIG. 7, data of the first symbol S1 may be '00', data of the second symbol S2 may be '01', data of the third symbol S3 may be '11', data of the fourth symbol S4 may be '10', and the permutation circuit 227_1 may receive first to fourth target likelihoods TGLL1 to TGLL4 corresponding to each symbol. When the expected symbol determiner 227b outputs a bit of the expected symbol ES from the most significant bit (MSB), the expected symbol determiner 227b may add the first target likelihood TGLL1 to the second target likelihood TGLL2 corresponding to each symbol by putting the first symbol S1 and the second symbol S2 of which MSB is 1, together as one combination. The expected symbol determiner 227b may put the third symbol S3 and the fourth symbol S4 of which the MSB is 0 together as a combination and add the third target likelihood TGLL3 to the fourth target likelihood TGLL4 corresponding toe each symbol.

In this manner, the permutation circuit 227_1 may provide to the divider 227_2 a likelihood of a bit being 0 and a likelihood of a bit being 1, based on combinations of the target likelihoods TGLL defined by bit from the MSB to the least significant bit (LSB). The divider 227_2 may receive a target likelihood of the bit being 0 and a target likelihood of the bit being 1 from the permutation circuit 227_1 and provide the two likelihoods to the log calculator 227_3. The log calculator 227_3 may generate bits of the expected symbol ES based on the likelihood of bit being 0 and the likelihood of bit being 1 received from the divider.

Figure 13:
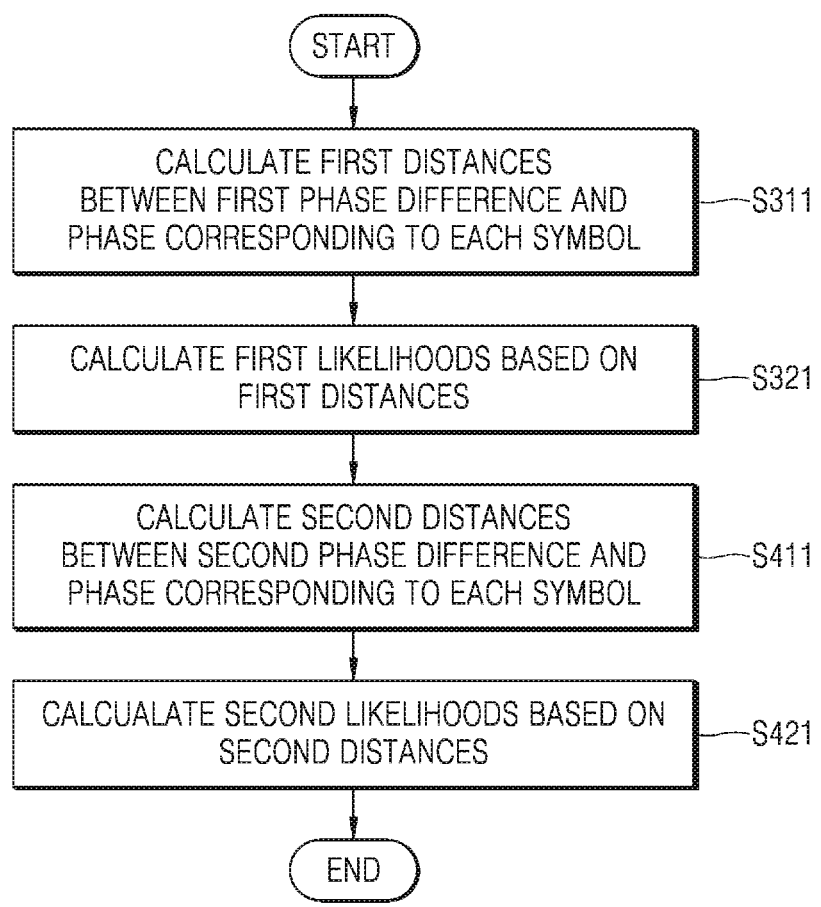
FIG. 13 is a flowchart illustrating a method of calculating first likelihoods and second likelihoods according to an embodiment.

FIG. 13 is a flowchart illustrating a method of calculating first likelihoods and second likelihoods according to an embodiment.

With reference to FIG. 13, each of the first likelihood generator and the second likelihood generator may receive the first phase difference PD1 and the second phase difference PD2, and calculate the first likelihoods and the second likelihoods based on a distance between each phase difference and each of the plurality of symbols.

In operation S311, the first likelihood generator may calculate a difference between the first phase difference PD1 and the phase corresponding to each of the plurality of symbols as the first distances. The first distance may be a Euclidean squared distance between the first phase difference PD1 and a phase corresponding to a symbol, which may be represented by the following Equation 6.

$$d_{1,j}^2 = 2(1-\cos(|\Delta_1\varnothing_{n-1} - c_j|)) \quad \text{Equation 6:}$$

Here, $d_{1,j}$ represents the first distance between the first phase difference and the phase corresponding to the $j^{th}$ symbol, $\Delta_1\varnothing_{n-1}$ represents the received first phase difference PD1 delayed by the delay circuit, and, $c_j$ represents the phase corresponding to the $j^{th}$ symbol. The first likelihood generator may calculate the Euclidean squared distance between the phases corresponding to all symbols and the first phase difference PD1.

In operation S312, the first likelihood generator may calculate the first likelihoods, based on the first distances. For example, the first likelihood generator may calculate the first likelihoods according to the following Equation 7.

$$Pr\{\Delta\phi_{n-1} = c_j\} = \frac{1}{\sqrt{2\pi\sigma^2}} \exp\left(-\frac{d_{1,j}^2}{2\sigma^2}\right) \quad \text{Equation 7}$$

Here, $Pr\{\Delta\phi_{n-1}=c_j\}$ represents the first likelihood, and $d_{1,j}^2$ represents the first distance which is a Euclidean squared distance regarding the $j^{th}$ symbol and the first phase difference PD1.

In operation S313, the second likelihood generator may calculate a difference between the second phase difference PD2 and the phase corresponding to each of the plurality of symbols as the second distances. The second distance may be a Euclidean squared distance between the second phase difference PD2 and a phase corresponding to a symbol, which may be represented by the following Equation 8.

$$d_{2,i,j}^2 = 2(1-\cos(|\Delta_2\varnothing_n - (c_i+c_j)|)) \quad \text{Equation 8:}$$

Here, $d_{2,i,j}$ represents the second distance between the second phase difference and the phase corresponding to a symbol into which the $i^{th}$ symbol and the $j^{th}$ symbol is combined, $\Delta_2\varnothing_n$ represents the second phase difference PD2, and $c_i+c_j$ represents the phase corresponding to the symbol into which the $i^{th}$ symbol and the $j^{th}$ symbol is combined. The second likelihood generator may calculate the Euclidean squared distance between the phases corresponding to all symbols and the second phase difference PD2.

In operation S314, the second likelihood generator may calculate the second likelihoods, based on the second distances. For example, the second likelihood generator may calculate the second likelihoods according to the following Equation 9.

$$Pr\{\Delta\phi_n = c_i \mid \Delta\phi_{n-1} = c_j\} = \frac{1}{\sqrt{2\pi\sigma^2}} \exp\left(-\frac{d_{2,i,j}^2}{2\sigma^2}\right) \quad \text{Equation 9}$$

Here, $Pr\{\Delta\phi_n=c_i|\Delta\phi_{n-1}=c_j\}$ represents the second likelihood, and $d_{2,i,j}^2$ represents the second distance, which is a Euclidean squared distance regarding the symbol obtained by adding the $i^{th}$ symbol to the $j^{th}$ symbol and the second phase difference PD2.

Figure 14:
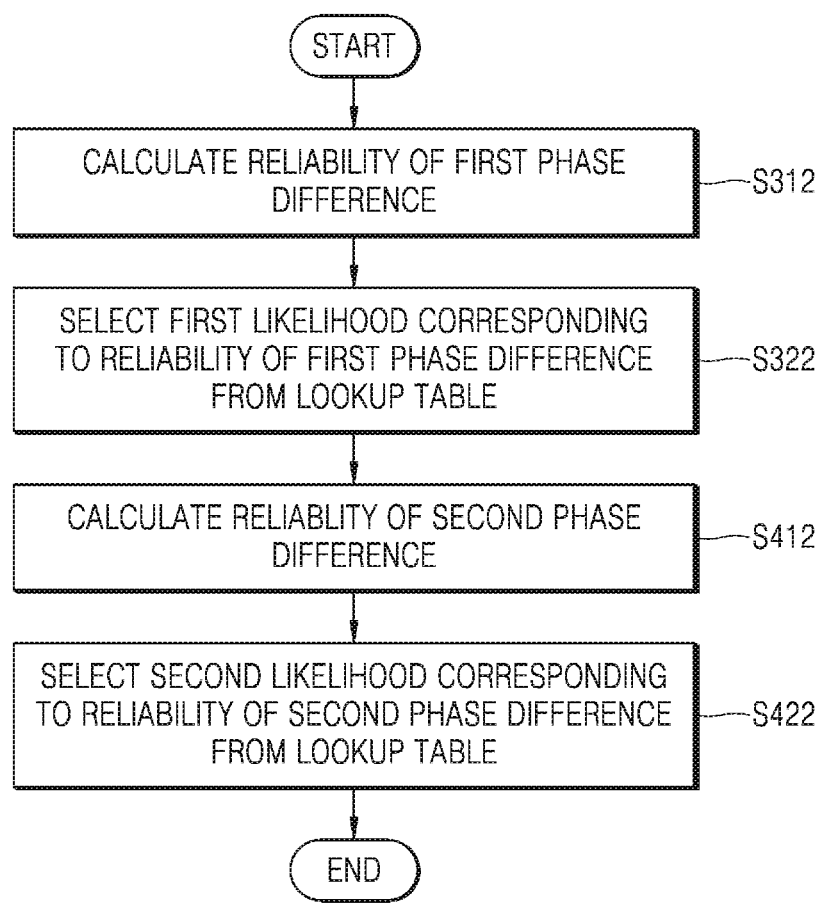
FIG. 14 is a flowchart illustrating a method of selecting at least some of first likelihoods and second likelihoods from a lookup table according to an embodiment.

FIG. 14 is a flowchart illustrating a method of selecting at least some of first likelihoods and second likelihoods from a lookup table according to an embodiment.

With reference to FIG. 14, at least some of the first likelihoods and the second likelihoods may be selected from the lookup tables according to FIG. 13 and other embodiments. The lookup table may be a table of likelihood values corresponding to reliability of the first phase difference PD1 and the second phase difference PD2 prestored in a memory of the communication device, and the demodulator 21 may load likelihood values stored in the lookup table from the memory.

In operation S312, the first likelihood generator may calculate the reliability of the first phase difference PD1. The first phase difference PD1 may be formed of data consisting of a series of bits, and the first likelihood generator may determine the reliability of the first phase difference PD1 according to the configuration of the bits. For example, when the first phase difference PD1 includes nine bits, the first likelihood generator may calculate the reliability of the first phase difference PD1 according to the following Equation 10.

$$\gamma_{\Delta\phi} = \{_{127-\Delta\phi[5:0], \, otherwise}^{\Delta\phi[5:0], \, if \, \Delta\phi[6]=0} \quad \text{Equation 10:}$$

Here, $\gamma_{\Delta\phi}$ represents the reliability of the phase difference, and $\Delta\phi[5:0]$ represents six bits of the phase difference from the LSB. That is, the reliability of the phase difference may have a greater value as the phase difference approaches a phase corresponding to each symbol, and have a smaller value as the phase difference approaches a decision boundary. According to an embodiment of FIG. 7, the decision boundary may be an X-axis and a Y-axis. According to Equation 10, when seven bits($\Delta\phi[6:0]$) from the LSB of the phase difference include '1000000' and '0111111,' the phase difference most nearly approaches the phase corresponding to the symbol, and the reliability of the phase difference may be 63, which is the greatest value.

The reliability according to one or more embodiments of the present disclosure is not limited to Equation 10, and the reliability of the phase difference in the EDR3 mode may be calculated according to the following Equation 11.

$$\gamma_{\Delta\phi} = \{63-\Delta\phi[4:0], \text{otherwise}}^{\Delta\phi[4:0], \text{ if } \Delta\phi[5]=0} \quad \text{Equation 11:}$$

In operation S322, the first likelihood generator may select a first likelihood corresponding to the reliability of the first phase difference PD1 from the lookup table based on the reliability of the first phase difference PD1. For example, the lookup table in the EDR2 mode and EDR3 mode may be defined as the following Equation 12.

$$LUT_{EDR2} = [16\ 18\ 20\ 22\ 23\ 25\ 26\ 27\ 28\ 29\ 30\ 31]$$

$$LUT_{EDR3} = [16\ 20\ 23\ 26\ 28\ 29\ 30\ 31] \quad \text{Equation 12:}$$

Here, $LUT_{EDR2}$ represents a lookup table in the EDR2 mode, and $LUT_{EDR3}$ represents a lookup table in the EDR3 mode.

The first likelihood generator may generate according to the following Equation 13 a first likelihood corresponding to the reliability of the first phase difference PD1 when the first phase difference PD1 is within the decision boundary corresponding to the $i^{th}$ symbol.

$$Pr\{\Delta\phi = c_i\} = \begin{cases} LUT_{EDR2}[\gamma_{\Delta\phi}]/32, & \text{if } 0 \le \gamma_{\Delta\phi} \le 8 \\ LUT_{EDR2}[9]/32, & \text{if } 9 \le \gamma_{\Delta\phi} \le 10 \\ LUT_{EDR2}[10]/32, & \text{if } 11 \le \gamma_{\Delta\phi} \le 12 \\ LUT_{EDR2}[11]/32, & \text{if } 13 \le \gamma_{\Delta\phi} \le 17 \\ 1, & \text{otherwise} \end{cases} \quad \text{Equation 13}$$

At this time, the likelihood that the first phase difference PD1 corresponds to the $j^{th}$ symbol adjacent to the $i^{th}$ symbol may be represented by the following Equation 14.

$$Pr\{\Delta\phi = c_j\} = 1 - Pr\{\Delta\phi = c_i\} \quad \text{Equation 14:}$$

In some examples, the first likelihood according to one or more embodiments of the present disclosure is not limited to Equations 13 and 14, and some of the first likelihoods in the EDR3 mode may be calculated according to the following Equation 15.

$$Pr\{\Delta\phi = c_i\} = \begin{cases} LUT_{EDR3}[\gamma_{\Delta\phi}]/32, & \text{if } 0 \le \gamma_{\Delta\phi} \le 6 \\ LUT_{EDR3}[7]/32, & \text{if } 7 \le \gamma_{\Delta\phi} \le 8 \\ 1, & \text{otherwise} \end{cases} \quad \text{Equation 15}$$

$$Pr\{\Delta\phi = c_i\} = 1 - Pr\{\Delta\phi = c_i\}$$

In operation S412, the second likelihood generator may calculate the reliability of the second phase difference PD2, based on the second phase difference PD2, and in operation S422, the second likelihood generator may select the second likelihood corresponding to the reliability of the second phase difference PD2 from the lookup table. The second likelihood generator may calculate the reliability of the second phase difference PD2 and the second likelihood in the same way as the first likelihood generator, and thus, detailed descriptions thereon are omitted.

The first likelihood generator and the second likelihood generator may generate the first likelihoods and the second likelihoods (e.g., as described in more detail herein, for example, with reference to FIGS. 13 and 14, but the techniques described herein are not limited thereto), and any one of the first likelihood generator and the second likelihood generator may generate the likelihoods (e.g., according to an embodiment of FIG. 13 while the other may generate the likelihoods according to an embodiment of FIG. 14, for example).

Figure 15:
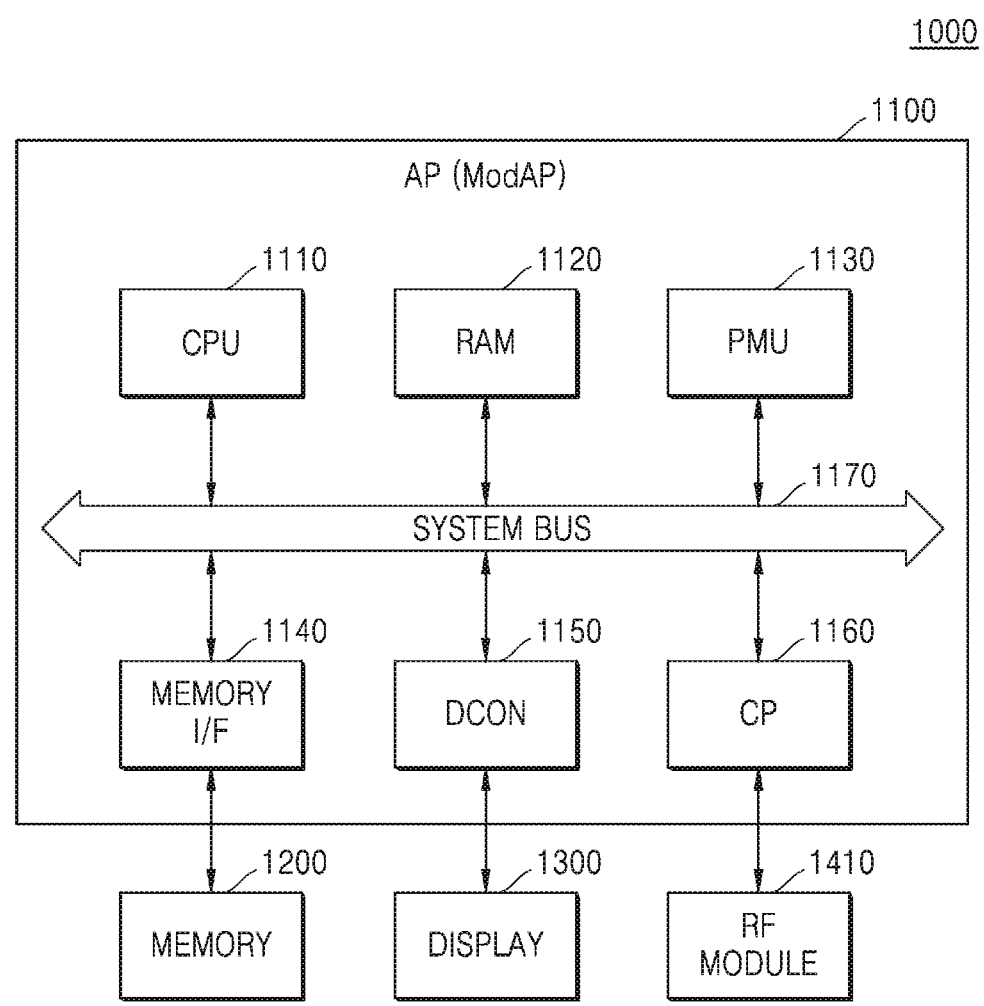
FIG. 15 is a block diagram illustrating components of a communication device according to an embodiment.

FIG. 15 is a block diagram illustrating components of a communication device according to an embodiment.

With reference to FIG. 15, a wireless communication device 1000 may include an application processor (AP) 1100, a memory 1200, a display 1300, and a radio frequency (RF) module 1410. In addition to this, the wireless communication device 1000 may further include various components such as a lens, a sensor, an audio module, etc.

In some aspects AP 1100 may represent or include an intelligent hardware device, (e.g., a general-purpose processing component, a digital signal processor (DSP), a central processing unit (CPU) 1110, a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the AP 1100 may be configured to operate a memory array using a memory controller. In other cases, a memory controller is integrated into the processor. In some cases, the AP 1100 is configured to execute computer-readable instructions stored in a memory to perform various functions. In some embodiments, AP 1100 includes special purpose components for modem processing, baseband processing, digital signal processing, or transmission processing.

Examples of a memory device include random access memory (RAM), read-only memory (ROM), or a hard disk. Examples of memory devices include solid state memory and a hard disk drive. In some examples, memory is used to store computer-readable, computer-executable software including instructions that, when executed, cause a processor to perform various functions described herein. In some cases, the memory contains, among other things, a basic input/output system (BIOS) which controls basic hardware or software operation such as the interaction with peripheral components or devices. In some cases, a memory controller operates memory cells. For example, the memory controller can include a row decoder, column decoder, or both. In some cases, memory cells within a memory store information in the form of a logical state.

The AP 1100 may be implemented as a System-on-Chip (SoC) and include a CPU 1110, RAM 1120, a power management unit (PMU) 1130, a memory interface (UF) 1140, a display controller (DCON) 1150, a communication processor 1160, and a system bus 1170. The AP 1100 may further include various intellectual properties (IPs) in addition to the above. The AP 1100 may be referred to as a ModAP as the functions of a communication processor chip are integrated into the AP 1100.

The CPU 1110 may generally control the operations of the AP 1100 and the wireless communication device 1000. The CPU 1110 may control the operations of each component of the AP 1100. The CPU 1110 may also be implemented by a multi-core. The multi-core refers to a computing component having two or more independent cores.

The RAM 1120 may temporarily store programs, data, or instructions. For example, the programs and/or data stored in the memory 1200 may be temporarily stored in the RAM 1120 according to the control or booting code of the CPU 1110. The RAM 1120 may be implemented as dynamic random access memory (DRAM) or static random access memory (SRAM).

The PMU 1130 may control the power of each component of the AP 1100. The PMU 1130 may also determine operation situations of each component of the AP 1100 and control the operations.

The memory OF 1140 may control the overall operations of the memory 1200 and also control the data exchange between each component of the AP 1100 and the memory 1200. The memory OF 1140 may write data on the memory 1200 or read data from the memory 1200 according to a request of the CPU 1110.

The display controller 1150 may transmit to the display 1300 image data to be displayed on the display 1300. The display 1300 may be implemented as a flat display or a flexible display such as a liquid crystal display (LCD), an organic light emitting diode (OLED) display, etc. A display 1300 may comprise a conventional monitor, a monitor coupled with an integrated display, an integrated display (e.g., an LCD display), or other means for viewing associated data or processing information. In some aspects, output devices other than the display 1300 may be used, such as printers, other computers or data storage devices, and computer networks.

The communication processor 1160 may be properly modulate data to be transmitted and recover received data for wireless communication. The communication processor 1160 may perform digital communication with the RF module 1410.

The RF module 1410 may convert a high frequency signal received through an antenna into a low frequency signal, and transmit the low frequency signal to the communication processor 1160. In addition, the RF module 1410 may convert a low frequency signal received from the communication processor 1160 into a high frequency signal, and transmit the high frequency signal to the outside of the wireless communication device 1000 through an antenna. In addition, the RF module 1410 may amplify or filter a signal.

The RF module 1410 according to an embodiment of the present disclosure may determine a symbol of a signal received through DPSK, and at this time, a symbol of a target signal received in a target sequence may be determined based on phases of previous signals received in a plurality of previous sequences.

In some aspects, software may include code to implement one or more aspects of the present disclosure. Software may be stored in a non-transitory computer-readable medium such as system memory or other memory. In some cases, the software may not be directly executable by the processor but may cause a computer (e.g., when compiled and executed) to perform functions described herein.

While one or more aspects of techniques described herein have been particularly shown and described with reference to embodiments thereof, it will be understood that various changes in form and details may be made therein without departing from the spirit and scope of the following claims.

What is claimed is:

1. A method of determining a symbol according to a phase difference between input signals input in order of time, the method comprising:

calculating a first phase difference between a phase of a first previous signal and a phase of a second previous signal, wherein the first previous signal is received prior to a target signal, and wherein the second previous signal is received prior to the first previous signal;

calculating a second phase difference between a phase of the target signal and the phase of the second previous signal;

calculating, based on the first phase difference and the second phase difference, target likelihoods that a phase difference between the target signal and the first previous signal corresponds to each of a plurality of symbols; and determining, based on the calculated target likelihoods, an expected symbol of the plurality of symbols for the target signal or an expected phase difference between the target signal and the first previous signal.

2. The method of claim 1, further comprising:

obtaining hard-decision phase differences for one or more received signals up to the second previous signal; and determining the phase of the second previous signal by adding up the hard-decision phase differences.

3. The method of claim 1, wherein the calculating of the target likelihoods comprises:

calculating a plurality of first likelihoods that the first phase difference corresponds to each of the plurality of symbols; and calculating a plurality of second likelihoods that the second phase difference corresponds to each of the plurality of symbols.

4. The method of claim 3, wherein the calculating of the first likelihoods comprises calculating a reliability of the first phase difference based on a code corresponding to the first phase difference, and the calculating of the second likelihoods comprises calculating a reliability of the second phase difference, based on a code corresponding to the second phase difference.

5. The method of claim 4, wherein:

the calculating of the first likelihoods comprises:

selecting a first likelihood corresponding to the reliability of the first phase difference from a lookup table; and determining the selected first likelihood as at least some of the first likelihoods, and the calculating of the second likelihoods comprises:

selecting a second likelihood corresponding to the reliability of the second phase difference from the lookup table; and determining the selected second likelihood as at least some of the second likelihoods.

6. The method of claim 3, wherein:

the calculating of the first likelihoods comprises:

calculating first distances between the first phase difference and a phase corresponding to each of the plurality of symbols; and calculating the first likelihoods based on the first distances, and the calculating of the second likelihoods comprises:

calculating second distances between the second phase difference and the phase corresponding to each of the plurality of symbols; and calculating the second likelihoods, based on the second distances.

7. The method of claim 6, wherein the first distances comprise a Euclidean squared distance between the phase corresponding to each of the plurality of symbols and the first phase difference, and the second distances comprise a Euclidean squared distance between the phase corresponding to each of the plurality of symbols and the second phase difference.

8. The method of claim 3, wherein the calculating of the target likelihoods comprises:
multiplying a likelihood that the first phase difference corresponds to a first symbol of the plurality of symbols by a likelihood that the second phase difference corresponds to a symbol obtained by combining the first symbol to a second symbol; and
determining the target likelihood that the phase difference between the target signal and the first previous signal corresponds to the second symbol by summing products of the first likelihood and the second likelihood when the first symbol corresponds to each of the plurality of symbols.

9. The method of claim 8, wherein the determining of the expected phase difference or the expected symbol for the target signal comprises determining the expected symbol based on a combination of the target likelihoods predetermined per bit.

10. The method of claim 8, wherein the determining of the expected phase difference or the expected symbol for the target signal comprises:
determining a first axis expected value and a second axis expected value, based on the target likelihood when the second symbol corresponds to each of the plurality of symbols; and
determining the expected phase difference, based on the first axis expected value and the second axis expected value.

11. The method of claim 10, wherein the determining of the first axis expected value and the second axis expected value comprises:
determining the first axis expected value by summing products of the target likelihood corresponding to each of the plurality of symbols and a first axis value; and
determining the second axis expected value by summing products of the target likelihood corresponding to each of the plurality of symbols and a second axis value.

12. A method of determining a symbol corresponding to an input signal, the method comprising:
generating a first phase difference between a first input signal and a previous signal, wherein the first input signal is input in a previous sequence prior to a target sequence, and wherein the previous signal is received prior to the previous sequence;
generating a second phase difference between a second input signal and the previous signal, wherein the second input signal is input in the target sequence; and
determining an expected phase difference between the second input signal and the first input signal based on the first phase difference and the second phase difference.

13. The method of claim 12, further comprising:
obtaining hard-decision phase differences for one or more signals received prior to receiving the previous signal; and
determining a phase of the previous signal by summing the hard-decision phase differences.

14. The method of claim 12, wherein the determining of the expected phase difference comprises:
calculating target likelihoods that a phase difference between the second input signal and the first input signal corresponds to each of a plurality of symbols based on the first phase difference and the second phase difference; and
determining the expected phase difference based on the target likelihoods and a phase of a symbol corresponding to each target likelihood.

15. The method of claim 14, wherein the calculating of the target likelihoods comprises:
calculating a plurality of first likelihoods that the first phase difference corresponds to each of the plurality of symbols; and
calculating a plurality of second likelihoods that the second phase difference corresponds to each of the plurality of symbols.

16. The method of claim 15, wherein the calculating of the first likelihoods comprises calculating a reliability of the first phase difference, based on a code corresponding to the first phase difference, and
the calculating of the second likelihoods comprises calculating a reliability of the second phase difference, based on a code corresponding to the second phase difference.

17. The method of claim 16, wherein:
the calculating of the first likelihoods comprises:
selecting a first likelihood corresponding to the reliability of the first phase difference from a lookup table; and
determining the selected first likelihood as at least some of the first likelihoods,
and the calculating of the second likelihoods comprises:
selecting a second likelihood corresponding to the reliability of the second phase difference from the lookup table; and
determining the selected second likelihood as at least some of the second likelihoods.

18. The method of claim 15, wherein:
the calculating of the first likelihoods comprises:
calculating first distances between the first phase difference and a phase corresponding to each of the plurality of symbols; and
calculating the first likelihoods based on the first distances,
and the calculating of the second likelihoods comprises:
calculating second distances between the second phase difference and a phase corresponding to each of the plurality of symbols; and
calculating the second likelihoods, based on the second distances.

19. A communication device comprising:
a first phase difference calculator configured to calculate a first phase difference between a phase of a first previous signal and a phase of a second previous signal, wherein the first previous signal is received prior to a target signal, and wherein the second previous signal is received prior to the first previous signal;
a second phase difference calculator configured to calculate a second phase difference between a phase of the target signal and the phase of the second previous signal;
a target likelihood generator configured to generate target likelihoods that a phase difference between the target signal and previous first previous signal corresponds to each of a plurality of symbols based on the first phase difference and the second phase difference; and
an expected symbol determiner configured to determine, based on the target likelihoods, an expected symbol of the plurality of symbols for the target signal or an expected phase difference between the target signal and the first previous signal.

20. The communication device of claim 19, wherein the target likelihood generator comprises:
- a first likelihood generator configured to calculate a plurality of first likelihoods that the first phase difference corresponds to each of the plurality of symbols; and
- a second likelihood generator configured to calculate a plurality of second likelihoods that the second phase difference corresponds to each of the plurality of symbols.

* * * * *